(12) United States Patent
Furuya et al.

(10) Patent No.: US 9,543,182 B2
(45) Date of Patent: Jan. 10, 2017

(54) ELECTROSTATIC CHUCK AND METHOD OF MANUFACTURING SEMICONDUCTOR DEVICE

(75) Inventors: Akira Furuya, Osaka (JP); Takamitsu Kitamura, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 733 days.

(21) Appl. No.: 13/305,139

(22) Filed: Nov. 28, 2011

(65) Prior Publication Data

US 2012/0134065 A1 May 31, 2012

(30) Foreign Application Priority Data

Nov. 29, 2010 (JP) ................. 2010-265790

(51) Int. Cl.
*H01L 21/683* (2006.01)

(52) U.S. Cl.
CPC ................. *H01L 21/6833* (2013.01)

(58) Field of Classification Search
CPC ............ H01L 21/677; H01L 21/6833
USPC ....................................... 361/234
See application file for complete search history.

(56) References Cited

U.S. PATENT DOCUMENTS

| 5,339,180 | A | 8/1994 | Katoh | |
|---|---|---|---|---|
| 6,514,790 | B1 * | 2/2003 | Plettner et al. | 438/106 |
| 2003/0176079 | A1 | 9/2003 | Sogard | |
| 2005/0232728 | A1 * | 10/2005 | Rice et al. | 414/217 |
| 2007/0048891 | A1 * | 3/2007 | Hayashi et al. | 438/66 |

FOREIGN PATENT DOCUMENTS

| JP | 01-274938 A | 11/1989 |
|---|---|---|
| JP | 06-118441 A | 4/1994 |
| JP | 06-167721 A | 6/1994 |
| JP | 2004-6706 A | 1/2004 |

OTHER PUBLICATIONS

Japanese Office Action dated Sep. 2, 2014, issued in corresponding Japanese Patent Application No. 2010-265790, w/English translation.

* cited by examiner

*Primary Examiner* — Ann Hoang
(74) *Attorney, Agent, or Firm* — Westerman, Hattori, Daniels & Adrian, LLP

(57) ABSTRACT

An electrostatic chuck device including: a plurality of adsorption areas having an electrode generating electrostatic attractive force; and a control portion controlling the electrostatic attractive force against each of the plurality of the adsorption areas independently of other adsorption areas.

13 Claims, 22 Drawing Sheets

ELECTROSTATIC CHUCK AND METHOD OF MANUFACTURING SEMICONDUCTOR DEVICE

CROSS-REFERENCE TO RELATED APPLICATION

This application is based upon and claims the benefit of priority of the prior Japanese Patent Application No. 2010-265790, filed on Nov. 29, 2010, the entire contents of which are incorporated herein by reference.

BACKGROUND (i) Technical Field

The present invention relates to an electrostatic chuck and a method of manufacturing a semiconductor device.

(ii) Related Art

For example, a nitride semiconductor device using a nitride semiconductor such as gallium nitride (GaN) is known as a high frequency and high output power device. Semiconductor layers of the nitride semiconductor device are formed on a SiC substrate or the like. A semiconductor chip having the nitride semiconductor device or the like has an area operating as a device and a pad area to be wire-bonded.

Japanese Patent Application Publication No. 6-118441 and Japanese Patent Application Publication No. 6-167721 disclose a technology in which a semiconductor chip formed on a wafer is moved to another substrate.

SUMMARY

An area not operating as a device such as a pad area is not needed to be formed on an expensive substrate such as a single crystal SiC substrate. And so, it is thought that a semiconductor chip having a device area is formed on a first substrate, and the semiconductor chip is moved to a second substrate. However, it is not easy to move semiconductor chips arrayed on the first substrate at a first interval to the second substrate so as to be arrayed at a second interval.

It is an object to provide an electrostatic chuck adsorbing a chip or the like with a part of a surface thereof and a method of manufacturing a semiconductor device for moving a semiconductor chip or the like so that alignment is changed.

According to an aspect of the present invention, there is provided an electrostatic chuck device including: a plurality of adsorption areas having an electrode generating electrostatic attractive force; and a control portion controlling the electrostatic attractive force against each of the plurality of the adsorption areas independently of other adsorption areas. By the invention, the electrostatic chuck device can adsorb a semiconductor chip or the like with a part of the electrostatic chuck surface.

In the present invention, the structure of the electrostatic chuck may include, in each of the adsorbing areas, a plurality of first electrodes for positive voltage and a plurality of second electrodes for negative voltage that are commonly controlled in one adsorbing area.

According to an aspect of the present invention, there is provided a method of manufacturing a semiconductor device including: adsorbing a plurality of semiconductor chips arrayed at a first interval with use of a first substrate including the electrostatic chuck device described above; reducing adsorbing force against the plurality of the semiconductor chips at a second interval that is larger than the first interval by controlling adsorbing force of the first substrate; picking up simultaneously the plurality of the semiconductor chips against which the adsorbing force was reduced; and adhering simultaneously the picked up semiconductor chips to a second substrate. By the invention, semiconductor chips can be set in other arrangement.

According to an aspect of the present invention, there is provided a method of manufacturing a semiconductor device including: picking up simultaneously a plurality of semiconductor chips arrayed at a first interval from a plurality of semiconductor chips arrayed at a second interval smaller than the first interval with use of the electrostatic chuck device described above; and adhering simultaneously the semiconductor chips to a second substrate. By the invention, semiconductor chips can be set in other arrangement.

DETAILED DESCRIPTION

A description will be given of a best mode for carrying the present invention.

Figure 1A:
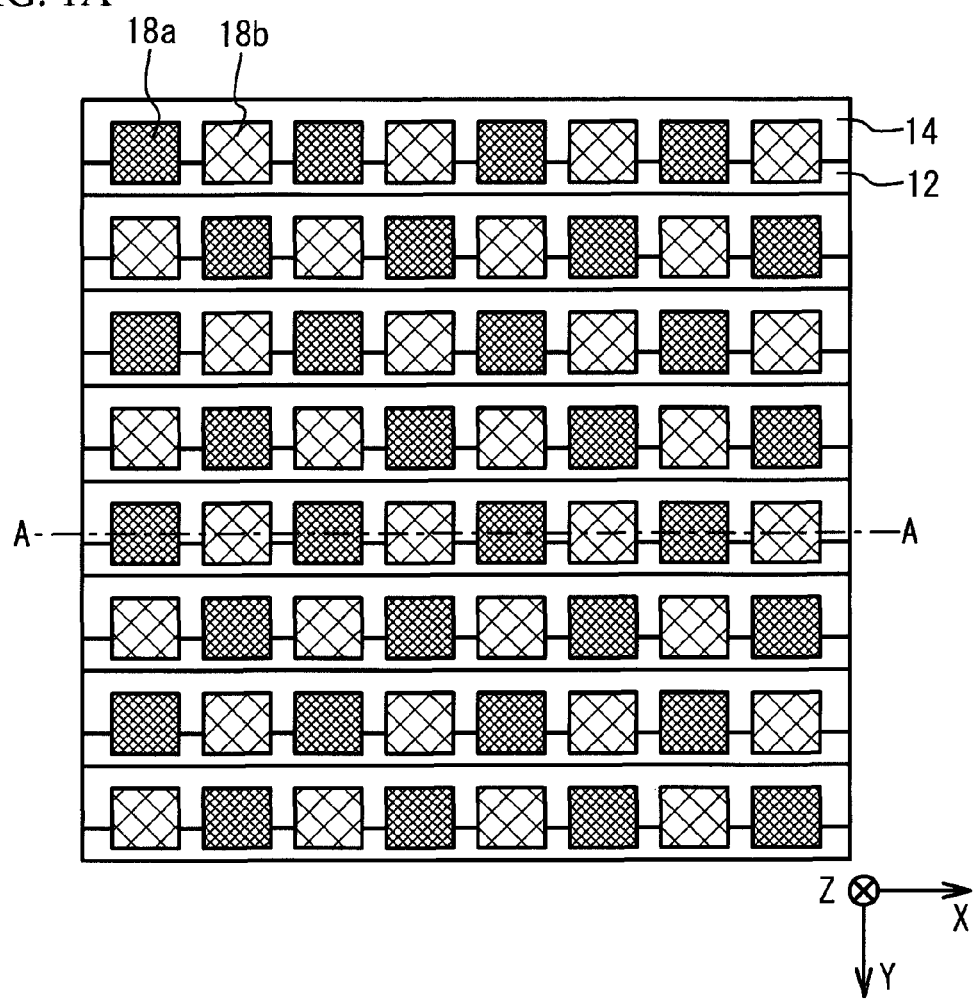
FIG. 1A illustrates a plane view of an electrostatic chuck in accordance with a first embodiment.
Figure 1B:
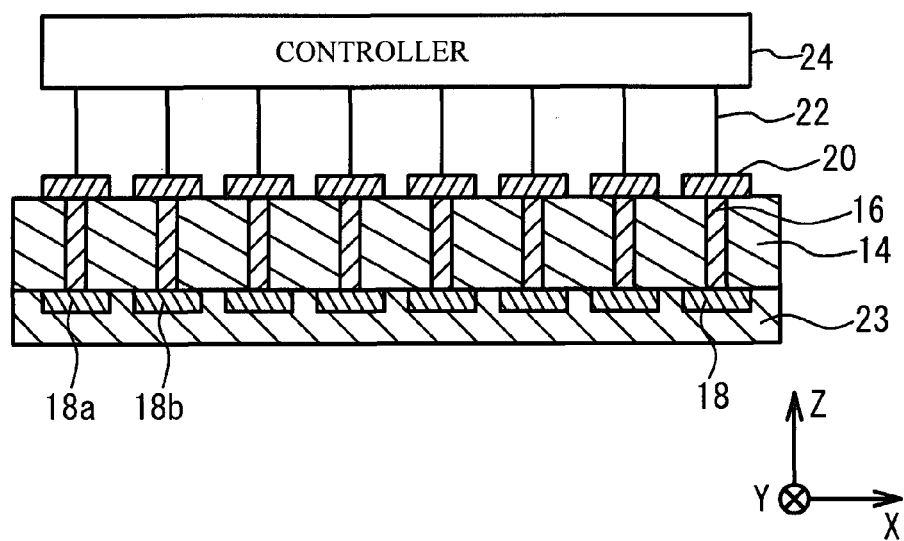
FIG. 1B illustrates a cross sectional view taken along a line A-A of FIG. 1A.

A first embodiments is an example of an electrostatic chuck. FIG. 1A illustrates a plane view of an electrostatic chuck in accordance with the first embodiment. FIG. 1B illustrates a cross sectional view taken along a line A-A of FIG. 1A. As illustrated in FIG. 1A, an insulating layer 12 and an insulating layer 14 are arrayed alternatively in a Y-direction. A matrix of an observe face electrode 18 is arrayed on the insulating layers 12 and 14 in an X-direction and the Y-direction. The observe face electrode 18 includes a first electrode 18a to which a positive voltage is applied and a second electrode 18b to which a negative voltage is applied. The first electrode 18a and the second electrode 18b are arrayed alternatively. For example, an electrode 18 adjacent to the first electrode 18a is the second electrode 18b. The electrode 18 adjacent to the second electrode 18b is the first electrode 18a. As illustrated in FIG. 1B, an electrode 16 is formed so as to penetrating the insulating layers 12 and 14 in a Z-direction. A reverse face electrode 20 is formed on an upper face of the electrode 16. An observe face electrode 18 is formed on a lower face of the electrode 16. An insulating film 23 is formed so as to cover the electrode 18 on the observe face of the insulating layers 12 and 14 (the lower face in FIG. 1B). The insulating film 23 is not illustrated in FIG. 1A. Each of the reverse face electrodes 20 is coupled to a control portion 24 via a wiring 22.

Figure 2A:
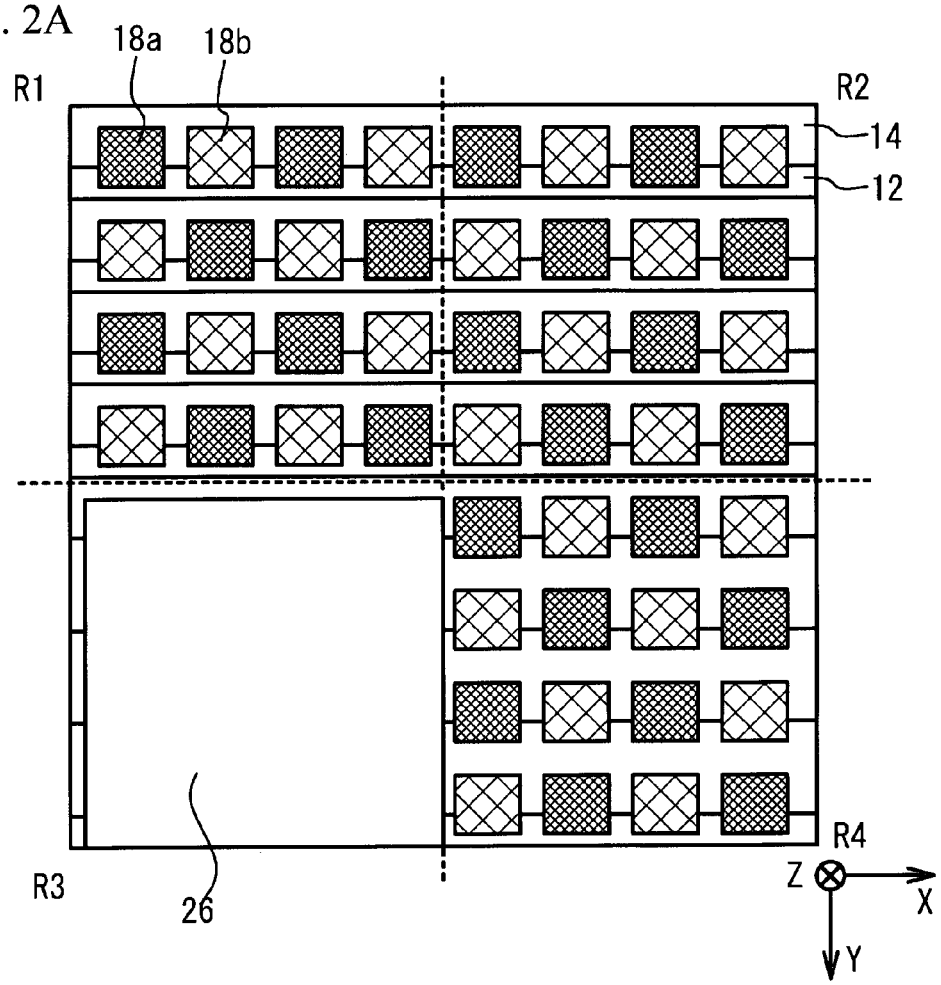
FIG. 2A and FIG. 2B illustrate an operation of the electrostatic chuck in accordance with the first embodiment.
Figure 2B:
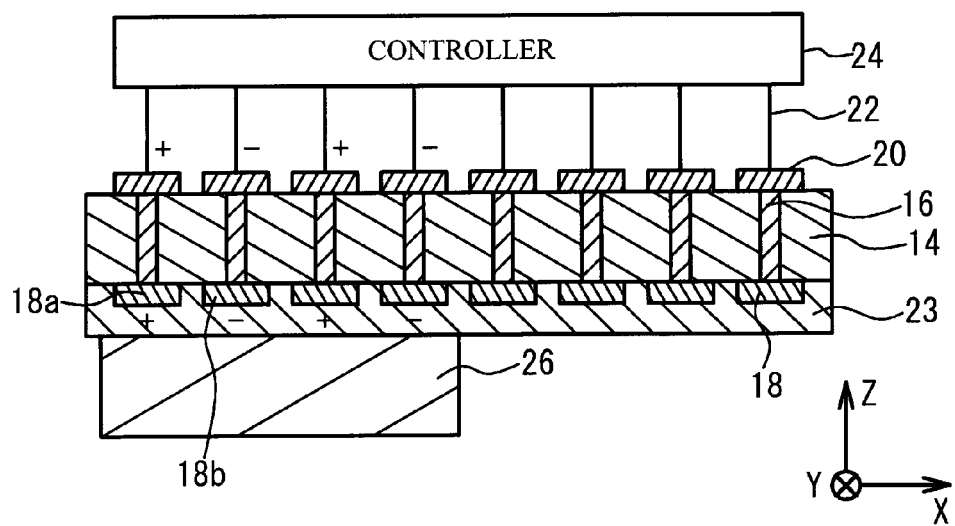

FIG. 2A and FIG. 2B illustrate an operation of the electrostatic chuck in accordance with the first embodiment. FIG. 2A illustrates a plane view of the electrostatic chuck. FIG. 2B illustrates a cross sectional view of the electrostatic chuck. Adsorption areas R1 through R4 are formed on the electrostatic chuck. Each size of the adsorption areas R1 through R4 is designed according to a size of a component such as a chip adsorbed thereto. The number of the adsorption areas is selected according to the number of a component such as a chip adsorbed thereto. Each of the adsorption areas R1 through R4 has the electrode 18 generating electrostatic attractive force when a voltage is applied thereto. The control portion 24 generates electrostatic attractive force independently on the electrode 18 in the adsorption areas R1 through R4 respectively. When the control portion 24 properly applies a positive voltage or a negative voltage to the observe face electrode 18 in the adsorption area R3, the first electrode 18a is charged positively and the second electrode 18b is charged negatively. Thus, the electrostatic attractive force is generated, and a chip 26 is adsorbed to the observe face of the electrostatic chuck to which a voltage is applied. In the first embodiment, a distance between the first electrode 18a and the second electrode 18b is small, and the insulating film 23 is thin. Further, the adsorbed chip is small. Therefore, even if the voltage applied between the first electrode 18a and the second electrode 18b is 100 V or less, sufficient electrostatic attractive force for adsorbing the chip is generated, because electrical field having influence on the chip 26 gets sufficiently large and the chip 26 is small. The others in the structure are the same as FIG. 1A and FIG. 1B. Therefore, the explanations for them are omitted.

In the electrostatic chuck in accordance with the first embodiment, the control portion 24 applies voltage to the each electrode 18 of the adsorption areas R1 through R4 independently. Thus, electrostatic attractive force is generated on each electrode 18 of the adsorption areas R1 through R4 independently. Alternatively, no electrostatic attractive force is generated on each electrode 18 of the adsorption areas R1 through R4. Thus, each chip is independently adsorbed to the adsorption areas R1 through R4. Alternatively, each chip is independently peeled from the adsorption areas R1 through R4. In this way, the chip can be adsorbed to a part of the observe face of the electrostatic chuck or can be peeled from a part of the observe face of the electrostatic chuck. The control portion 24 has a voltage generation circuit, a voltage supply circuit, and a microprocessor. The voltage generation circuit generates a voltage applied to the electrode 18. The voltage supply circuit receives an instruction from the microprocessor and applies a voltage generated by the voltage generation circuit to an arbitrary electrode 18.

Figure 3A:
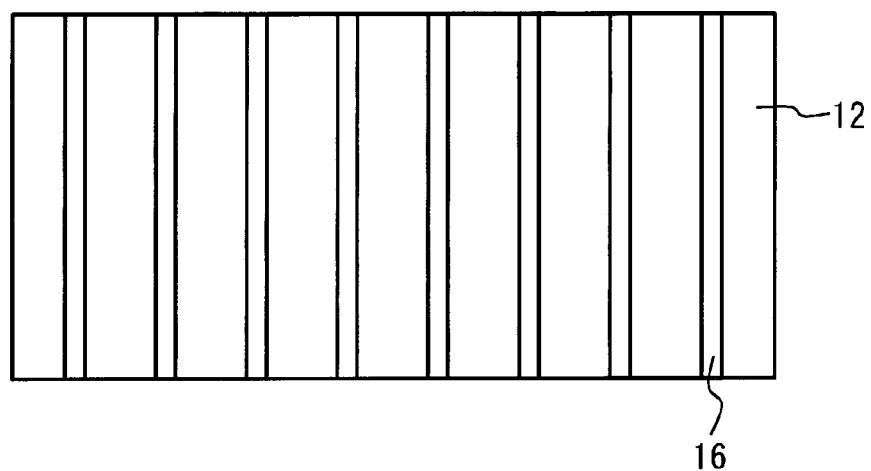
FIG. 3A and FIG. 3B illustrate a method of manufacturing the electrostatic chuck in accordance with the first embodiment.
Figure 3B:
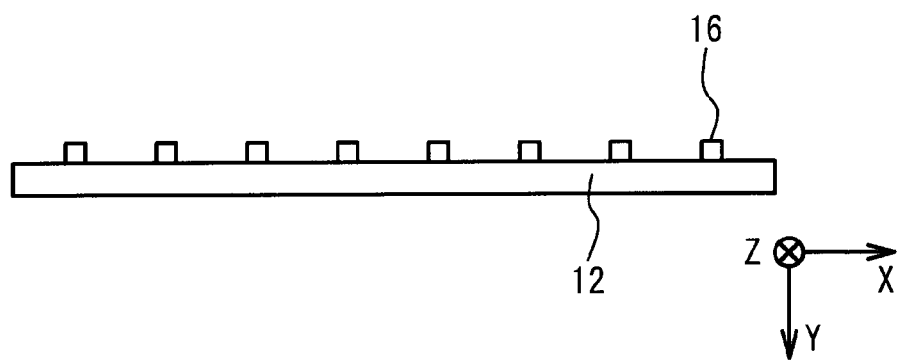

FIG. 3A through FIG. 6 illustrate a manufacturing method of the electrostatic chuck in accordance with the first embodiment. FIG. 3A illustrates a plane view of the insulating layer 12. FIG. 3B illustrates a side view of the insulating layer 12. As illustrated in FIG. 3A and FIG. 3B, the insulating layer 12 such as a glass is provided on the X-Z plane. A metal film such as Au or Al is formed on the insulating layer 12 with a method of vacuum evaporation and lift off. Thus, a plurality of the electrodes 16 are formed so as to extend in the Z-direction on the insulating layer 12. The thickness of the insulating layer 12 is, for example, 50 μm to 200 μm. The thickness of the electrode 16 is, for example, 1 μm.

Figure 4A:
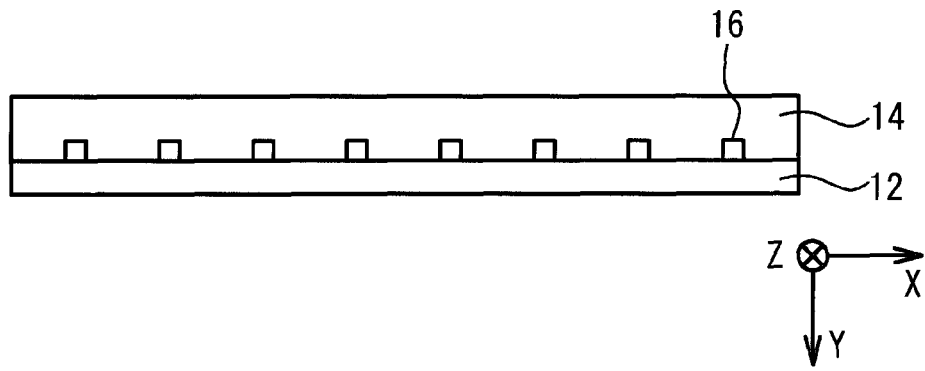
FIG. 4A and FIG. 4B illustrate the method of manufacturing the electrostatic chuck in accordance with the first embodiment.
Figure 4B:
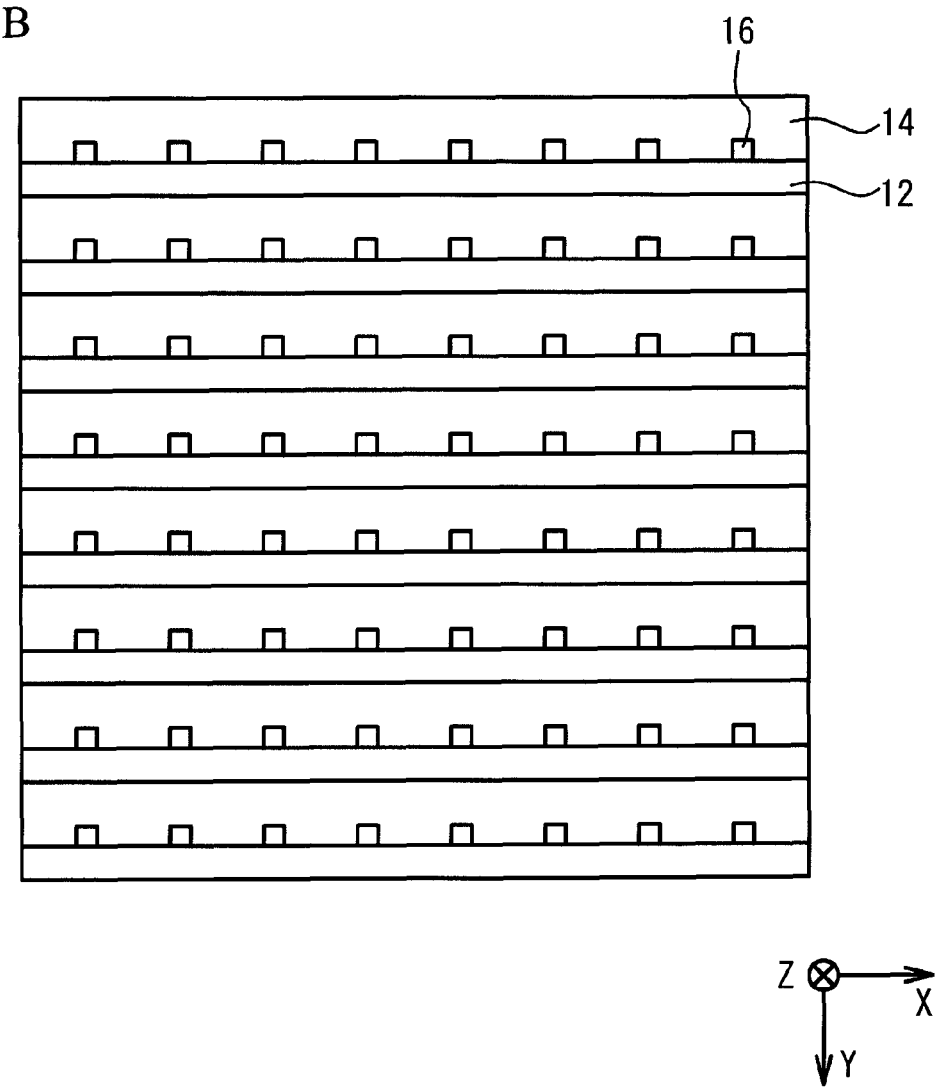

FIG. 4A and FIG. 4B illustrate a side view. As illustrated in FIG. 4A, the insulating layer 14 is formed so as to cover the electrode 16 on the insulating layer 12. The insulating layer 14 is, for example, made of polyimide resin having a thickness of 10 μm. The insulating layer 14 is formed by coating and curing. An interval of the electrodes 16 in the X-direction is, for example, approximately a sum of the thickness of the insulating layer 12 and the thickness of the insulating layer 14. As illustrated in FIG. 4B, the insulating layer 12 on which the electrode 16 and the insulating layer 14 are formed is laminated and is adhered in the Y-direction. The electrode 16 is approximately arrayed in a matrix of a square. The interval of the electrode 16 in the X-direction and the Y-direction may be designed according to a size of an adsorbed chip or the like.

Figure 5:
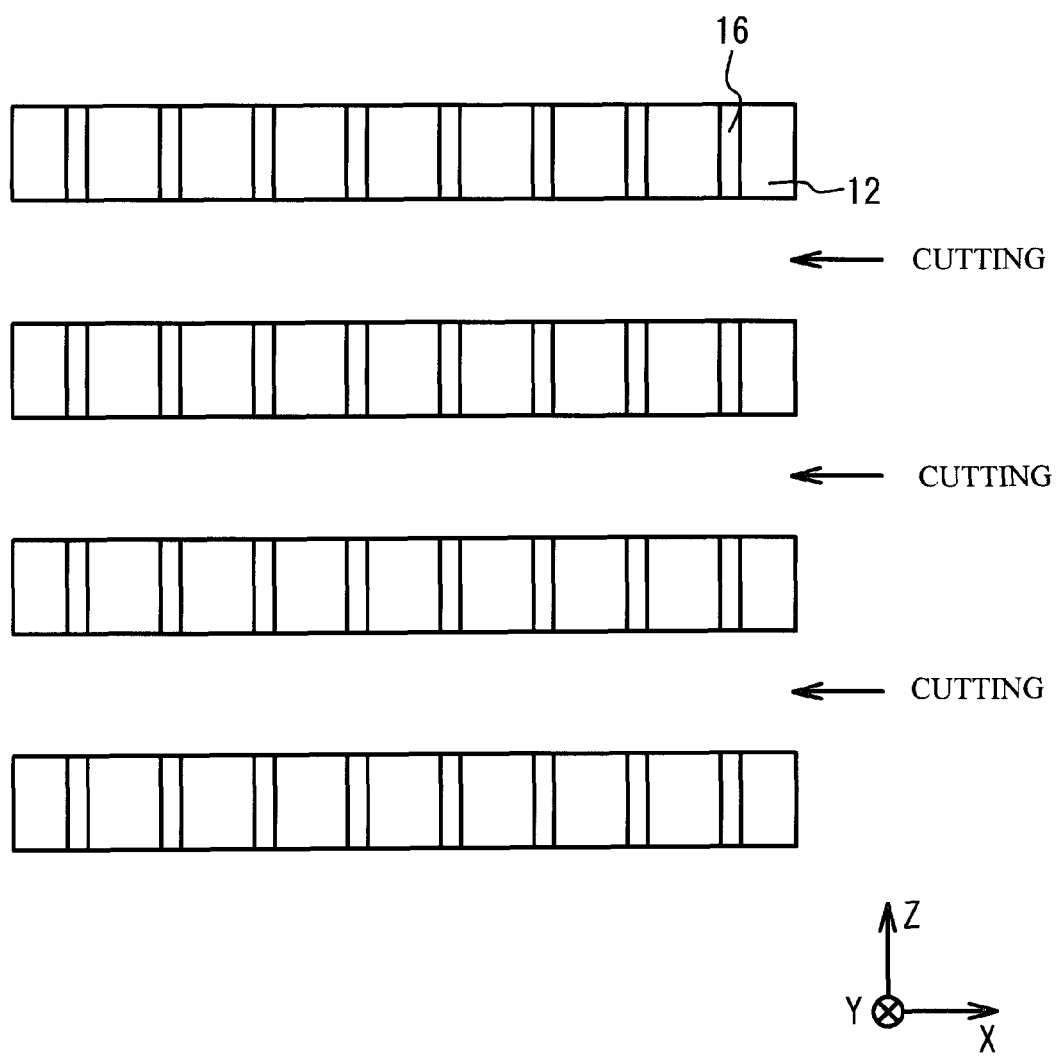
FIG. 5 illustrates the method of manufacturing the electrostatic chuck in accordance with the first embodiment.

FIG. 5 illustrates a plane view of the insulating layers 12 and 14. As illustrated in FIG. 5, the insulating layers 12 and 14 laminated in the Y-direction are cut along the X-Y plane. In the cutting, a dicing method is used. The cutting width is, for example, 500 μm. After cutting, the cross section is polished. Thus, a board on which the electrode 16 extends in the Z-direction is formed, when it is assumed that the cross section of the X-Y planes are an upper face and a lower face.

Figure 6:
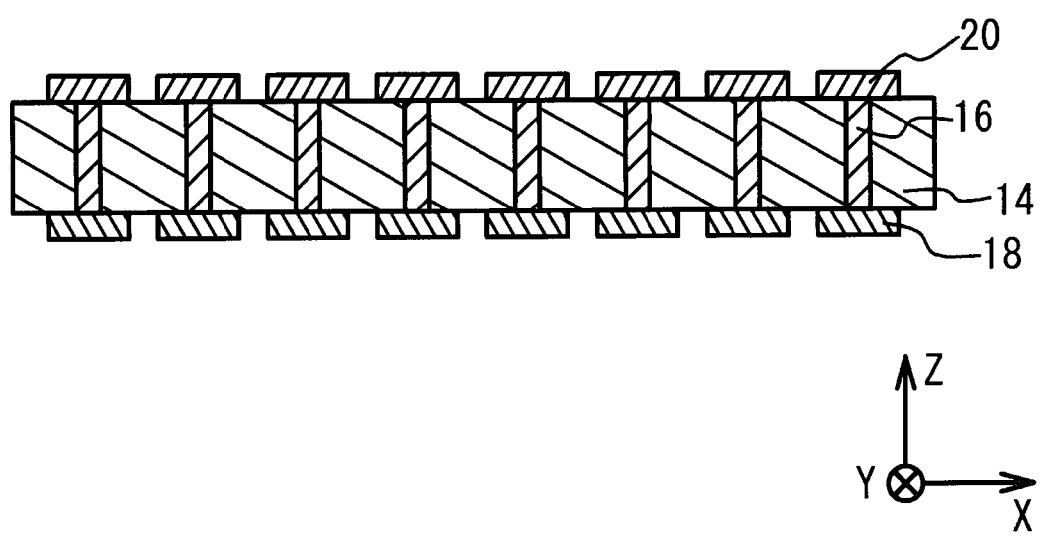
FIG. 6 illustrates the method of manufacturing the electrostatic chuck in accordance with the first embodiment.

FIG. 6 illustrates a cross sectional view along the X-Z plane. As illustrated in FIG. 6, the observe face electrode 18 is formed on an observe face of the insulating layers 12 and 14. The reverse face electrode 20 is formed on a reverse face of the insulating layers 12 and 14. The observe face electrode 18 and the reverse face electrode 20 are formed so as to be in contact with the electrode 16. The observe face electrode 18 and the reverse face electrode 20 are, for example, a metal film such as Al or Au, and are formed with a vapor deposition method and a lift off method. The insulating film 23 is further formed on the observe face side. The wiring 22 coupled to the control portion 24 is coupled to the reverse face electrode 20. With the processes, the electrostatic chuck illustrated in FIG. 1A and FIG. 1B is fabricated.

Figure 7A:
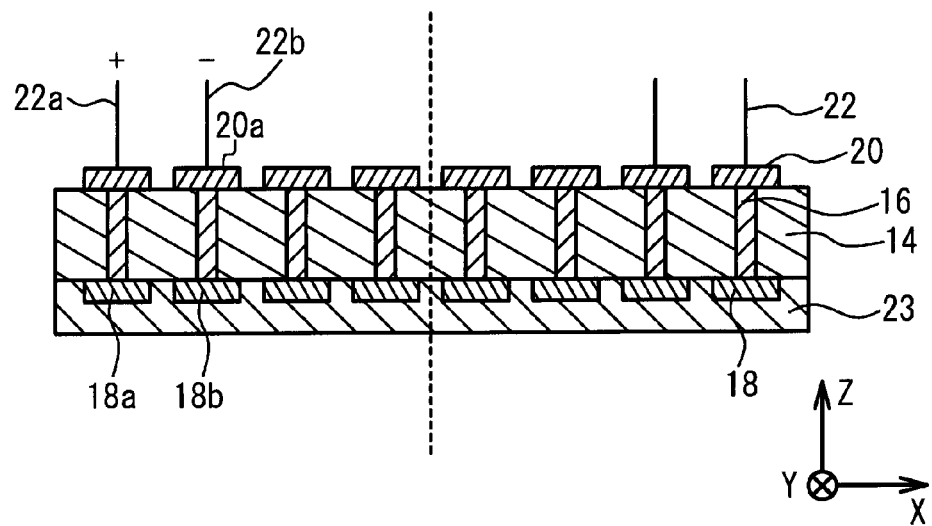
FIG. 7A and FIG. 7B illustrate an electrostatic chuck in accordance with a first modified embodiment of the first embodiment.
Figure 7B:
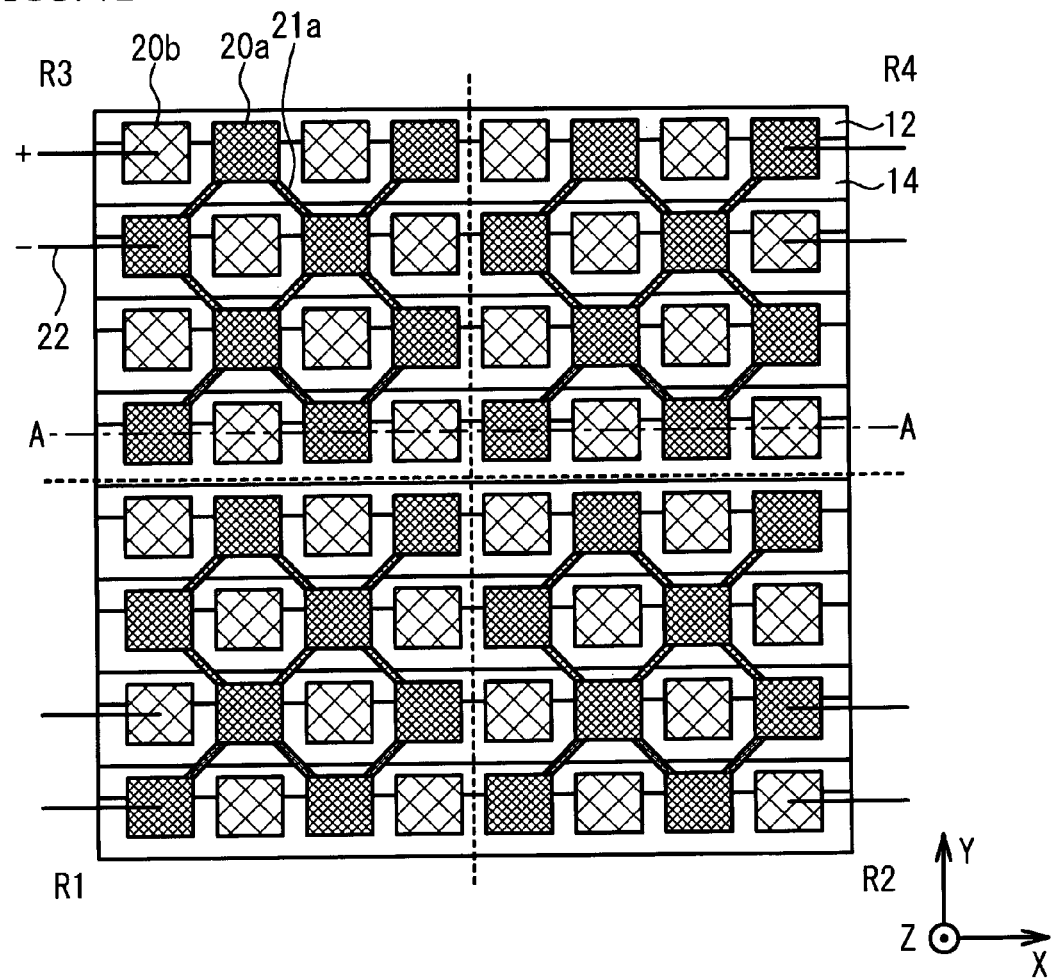
Figure 8:
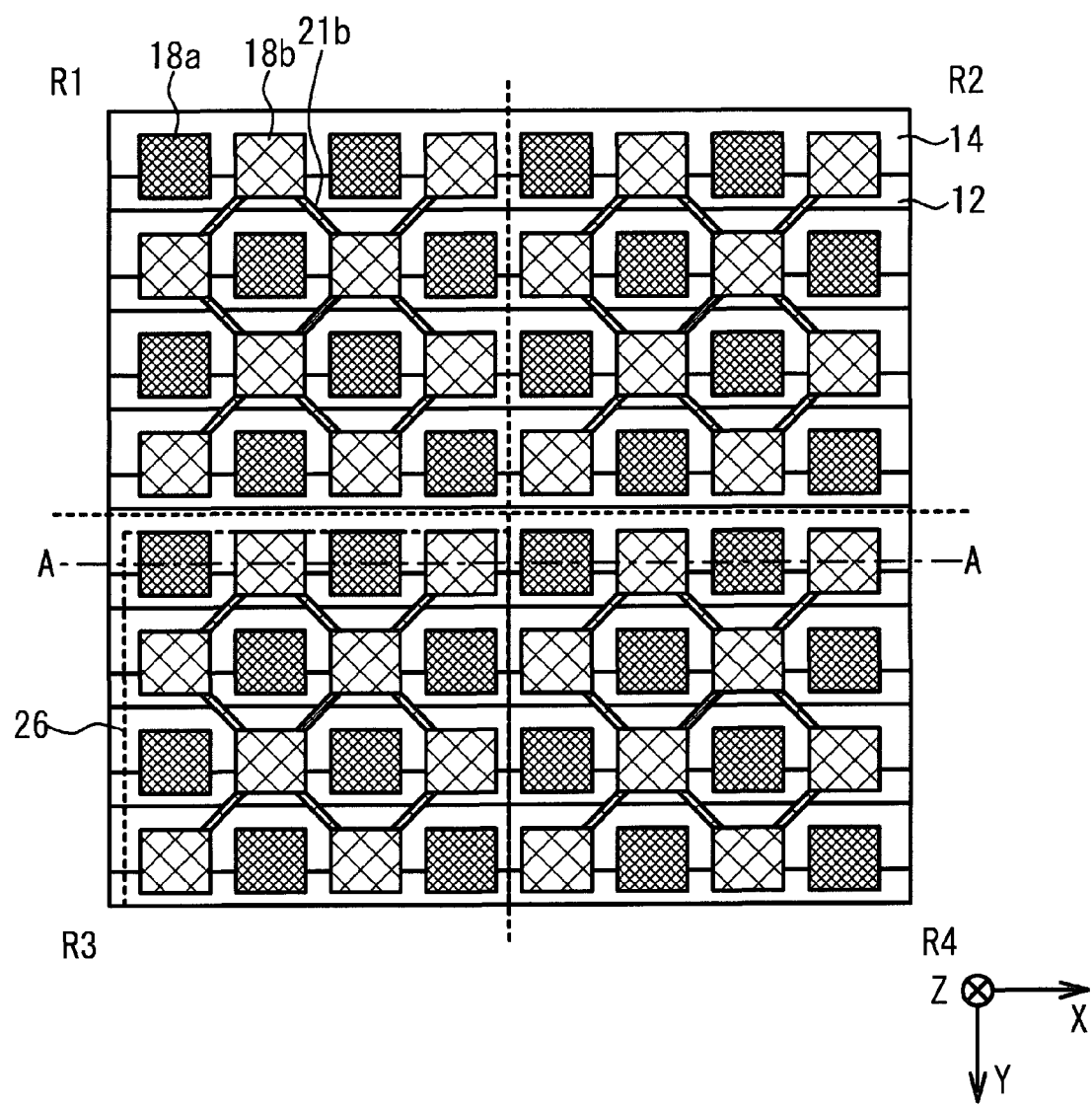
FIG. 8 illustrates the electrostatic chuck in accordance with the first modified embodiment of the first embodiment.

FIG. 7A through FIG. 8 illustrate an electrostatic chuck in accordance with a first modified embodiment of the first embodiment. FIG. 7A illustrates a cross sectional view, and FIG. 7B illustrates a top view (viewed from the reverse face side). FIG. 8 illustrates a bottom view (viewed from the observe face side). In FIG. 8, the insulating film 23 is not illustrated. As illustrated in FIG. 7A, a pair of wirings including a wiring 22a for applying a positive voltage and a wiring 22b for applying a negative voltage are coupled to each area of the reverse face electrode 20 according to each chip.

As illustrated in FIG. 8, a wiring 21b electrically coupling the electrodes 18b to which a negative voltage is applied is formed with the same metal as the observe face electrode 18. The electrodes 18b are commonly coupled to each other with the wiring 21b in the adsorption areas R1 to R4. The electrodes 18b between the adsorption areas R1 to R4 are electrically isolated from each other.

As illustrated in FIG. 7B, a wiring 21a electrically coupling the electrodes 20a to which a positive voltage is applied is formed when forming the reverse face electrode 20. In the adsorption areas R1 to R4, the electrodes 20a are commonly coupled to each other with the wiring 21a. The electrodes 20a between the adsorption areas R1 to R4 are electrically isolated from each other.

As mentioned above, the first electrodes 18a in the adsorption areas R1 to R4 are electrically coupled to each other with one of the wiring 21a or the wiring 21b formed together with the observe face electrode 18 and the reverse face electrode 20. The second electrodes 18b in the adsorption areas R1 to R4 are electrically coupled to each other with the other of the wiring 21a or the wiring 21b formed together with the observe face electrode 18 and the reverse face electrode 20. The first electrodes 18a between the adsorption areas R1 to R4 are electrically isolated from each other. The second electrodes 20a between the adsorption areas R1 to R4 are electrically isolated from each other. Therefore, the control portion 24 can apply a positive voltage to the first electrode 18a according to an adsorbed chip and can apply a negative voltage to the second electrode 18b at a time.

Figure 9A:
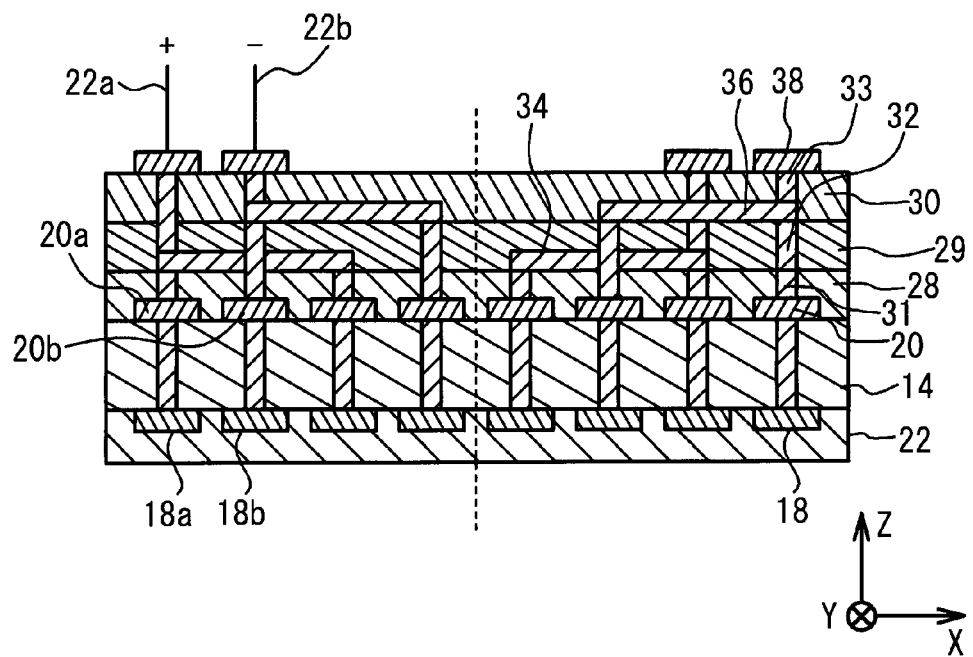
FIG. 9A and FIG. 9B illustrate an electrostatic chuck in accordance with a second modified embodiment of the first embodiment.
Figure 9B:
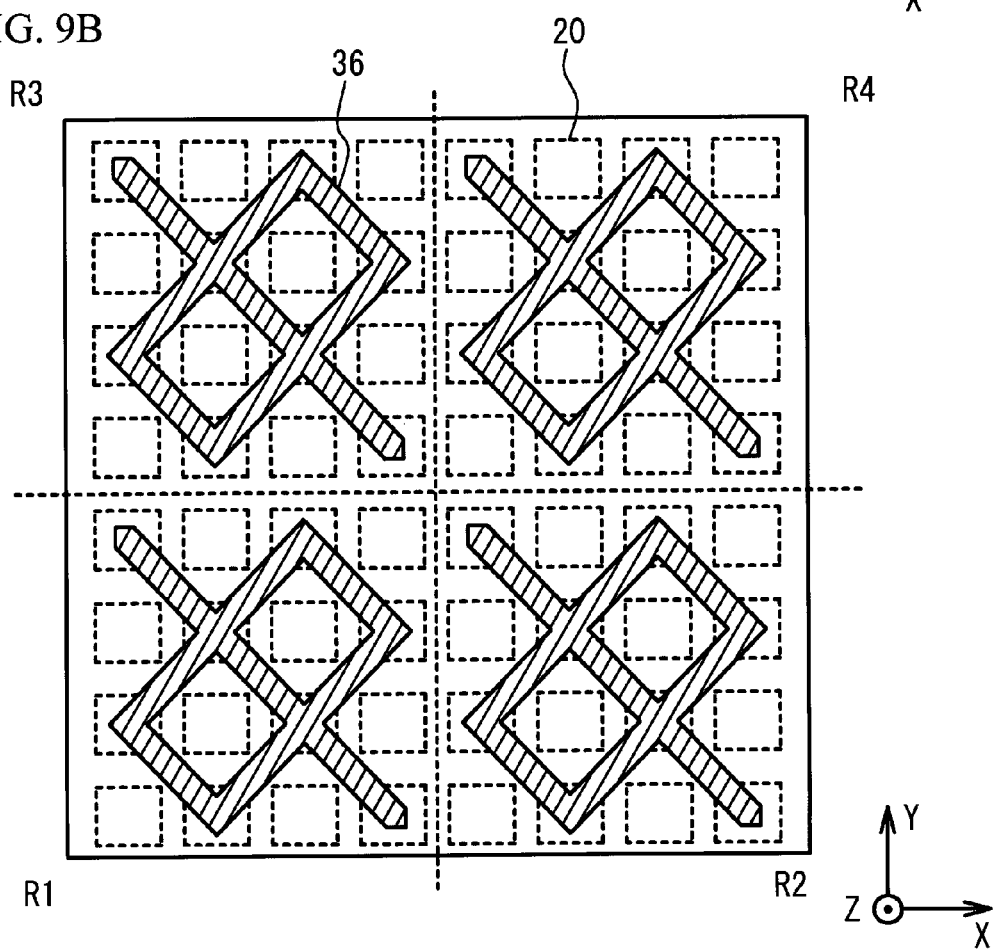
Figure 10:
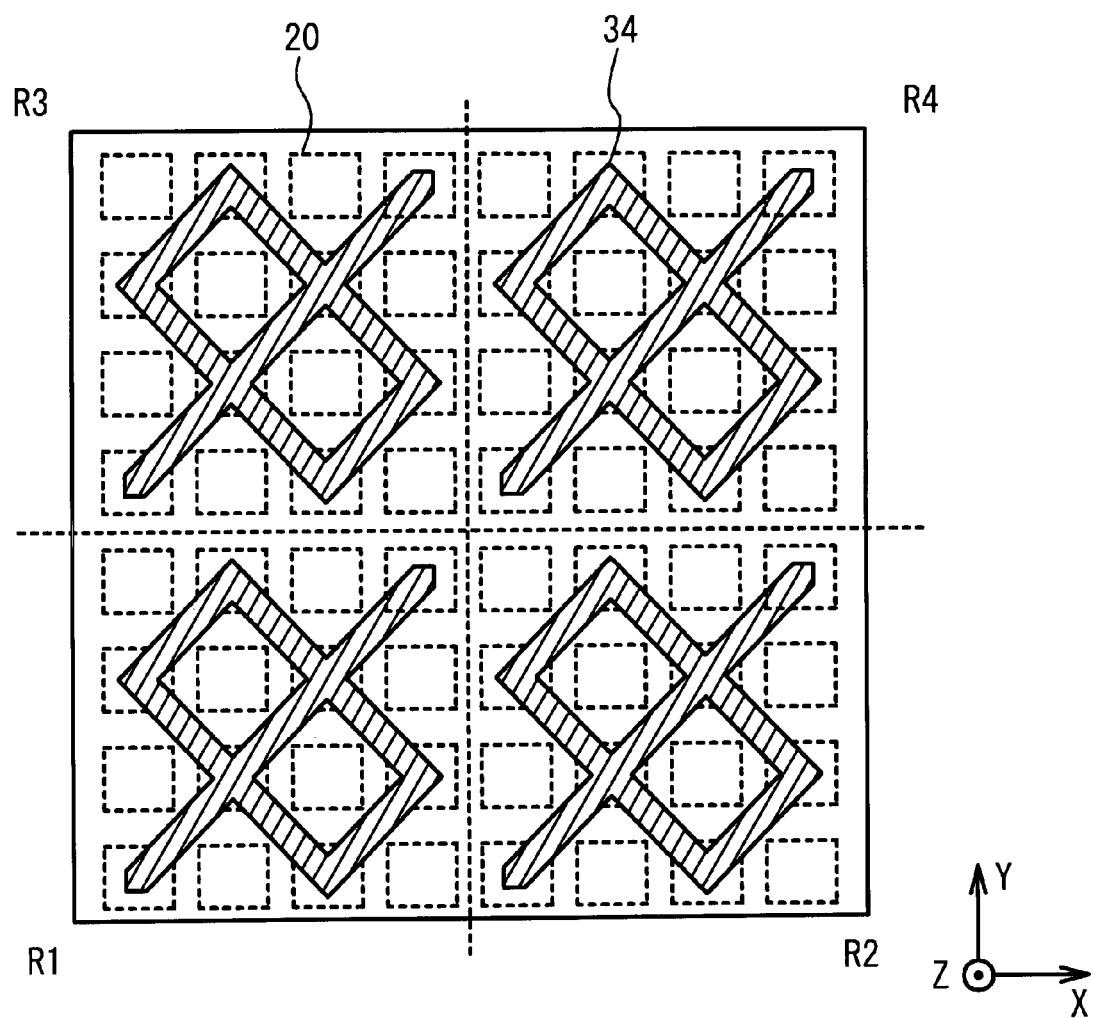
FIG. 10 illustrates the electrostatic chuck in accordance with the second modified embodiment of the first embodiment.

FIG. 9A through FIG. 10 illustrate an electrostatic chuck in accordance with a second modified embodiment of the first embodiment. FIG. 9A illustrates a cross sectional view. FIG. 9B illustrates a plane view of a wiring 36. FIG. 10 illustrates a plane view of a wiring 34. As illustrated in FIG. 9A, insulating layers 28 to 30 are formed on the insulating layers 12 and 14. The insulating layers 28 to 30 are, for example, made of polyimide. Contact wirings 31 to 33 are formed so as to penetrate the insulating layers 28 to 30 respectively. The wiring 34 is provided between the insulating layer 28 and the insulating layer 29. The wiring 36 is provided between the insulating layer 29 and the insulating layer 30. An electrode 38 is formed on the insulating layer 30.

FIG. 9B illustrates the wiring 36. As illustrated in FIG. 9B, the electrodes 18b are commonly coupled to each other with the wiring 36 in the adsorption areas R1 to R4. The electrodes 18a between the adsorption areas R1 to R4 are electrically isolated from each other. FIG. 10 illustrates the wiring 34. As illustrated in FIG. 10, the electrodes 18a are commonly coupled to each other with the wiring 36 in the adsorption areas R1 to R4. The electrodes 18b between the adsorption areas R1 to R4 are electrically isolated from each other.

As mentioned above, the first electrodes 18a in the adsorption areas R1 to R4 are electrically coupled to each other with the wiring 34 formed on the reverse face electrode 20. The second electrodes 18b in the adsorption areas R1 to R4 are formed on the reverse face electrode 20 and are electrically coupled to each other with the wiring 36 that is different from the wiring 34. The first electrodes 18a between the different adsorption areas R1 to R4 are electrically isolated from each other. The second electrodes 20a in the adsorption areas R1 to R4 are electrically isolated from each other. Thus, the control portion 24 can apply a positive voltage to the first electrode 18a according to an adsorbed chip and can apply a negative voltage to the second electrode 18b, as well as the first modified embodiment.

As mentioned in the first and second modified embodiments, the first wiring 21a or the wiring 34 couples the first electrodes 18a to each other in each of the adsorption areas R1 to R4. The second wiring 21b or the wiring 36 couples the second electrodes 18b to each other in each of the adsorption areas R1 to R4. Thus, the control portion 24 can apply a positive voltage to the first electrodes 18a according to an adsorbed chip at a time, and can apply a negative voltage to the second electrodes 18b according to an adsorbed chip at a time. Thus, the first electrodes 18a and the second electrodes 18b are controlled in common in the same adsorption areas R1 to R4.

In accordance with the first and second modified embodiments, it is possible to reduce the number of the wirings 22 coupling the electrostatic chuck and the control portion 24 and the number of power suppliers for applying voltage in the control portion 24. And, the electrostatic chuck device is simplified. A plurality of the first electrodes 18a and a plurality of the second electrodes 18b contribute to uniformity of adsorbing force in the adsorption area. That is, when conductivity of a chip acting as an adsorbing objective is low, the adsorbing force is determined with electrostatic attractive force between the first electrode 18a and the second electrode 18b. Therefore, when the plurality of the first electrodes 18a and the plurality of the second electrodes 18b are provided and many gaps are located in an adsorption area, the uniformity of adsorbing force is improved.

[Second Embodiment]

Figure 11A:
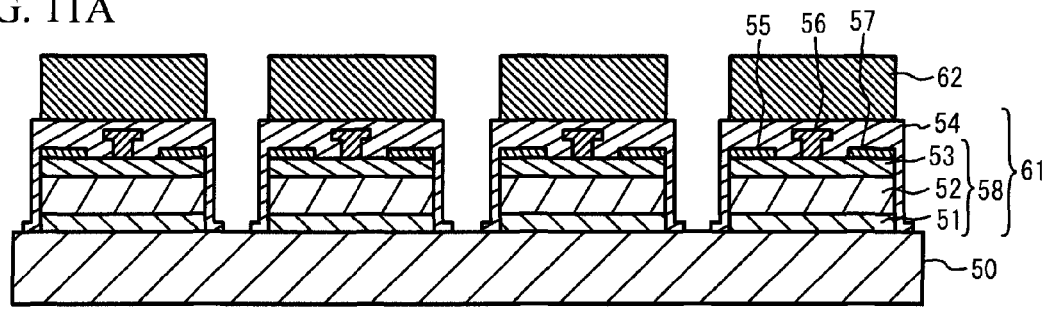
FIG. 11A through FIG. 11D illustrate a method of manufacturing a semiconductor device in accordance with a second embodiment.

A second embodiment is an example of a manufacturing method of a semiconductor device with use of the electrostatic chuck in accordance with the first embodiment. FIG. 11A through FIG. 18C illustrate a cross sectional view for explaining the manufacturing method of a semiconductor device in accordance with the second embodiment. As illustrated in FIG. 11A, a plurality of semiconductor elements 61 are formed on a substrate 50. The substrate 50 is, for example, a silicon substrate. The semiconductor element 61 is an FET (Field Effect Transistor) made of nitride semiconductor. An AlN layer 51 having a thickness of 0.1 μm is formed on the substrate 50. An undoped GaN layer 52 having a thickness of 2 μm is formed on the AlN layer 51. An AlGaN layer 53 (a composition ratio of Al is 0.25) having a thickness of 25 nm is formed on the GaN layer 52. The AlN layer 51, the undoped GaN layer 52 and the AlGaN layer 53 act as a semiconductor layer 58 and are formed with an MOVPE (Metal Organic Vapor Phase Epitaxy) method. A source electrode 55, a drain electrode 57 and a gate electrode 56 are formed on the AlGaN layer 53. The source electrode 55 and the drain electrode 57 have a structure in which Ti and Al are laminated in this order from the substrate 50 side. The gate electrode 56 has a structure in which Ni and Au are laminated in this order from the substrate 50 side. The semiconductor layer 58 between the semiconductor elements 61 is removed by an etching process. Thus, a plurality of the semiconductor elements 61 are held on the substrate 50 so that a side face of the semiconductor elements 61 is spaced from each other. A silicon nitride film is formed so as to cover the semiconductor layer 58, the source electrode 55, the drain electrode 57 and the gate electrode 56 as a protective film 54. A protective film 62 made of an insulating film such as polyimide is formed on the semiconductor element 61. The nitride semiconductor is such as GaN, AlN, InN, AlGaN, InGaN, AlInGaN, or AlInN.

Figure 11B:
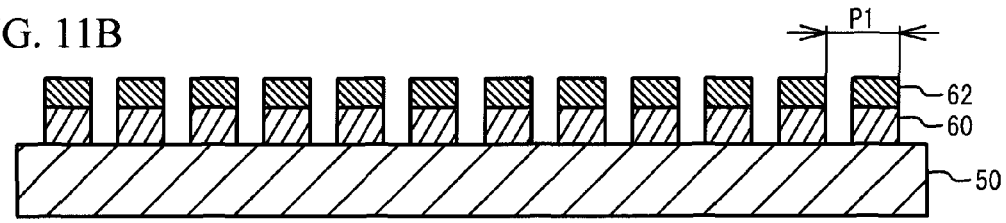
Figure 11C:
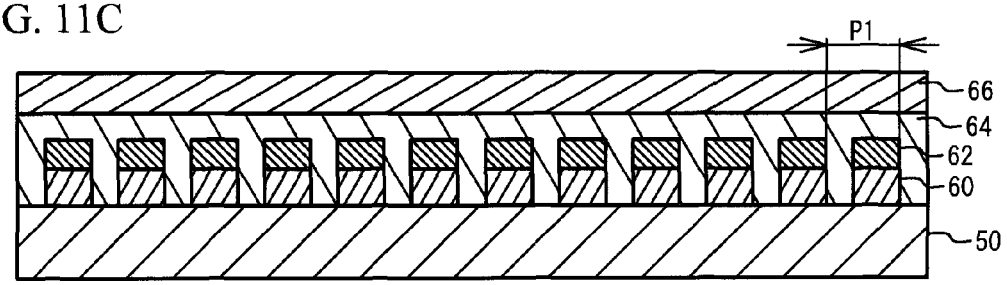

As illustrated in FIG. 11B, an internal structure of the semiconductor element 61 is omitted in the following description. The semiconductor elements 61 are arrayed at an interval P1. The interval P1 is, for example, 300 μm or less. As illustrated in FIG. 11C, wax is used as a temporal fixing agent 64 so as to cover the semiconductor element 61 and the protective film 62. And, the semiconductor element 61 is temporally fixed to a substrate 66. It is preferable that the temporal fixing agent 64 is insoluble in hydrofluoric and nitric acid and is soluble in organic solvent. For example, terpene phenol resin is used as the temporal fixing agent 64. It is preferable that the substrate 66 is insoluble in hydrofluoric and nitric acid and organic solvent. For example, a sapphire substrate is used as the substrate 66.

Figure 11D:
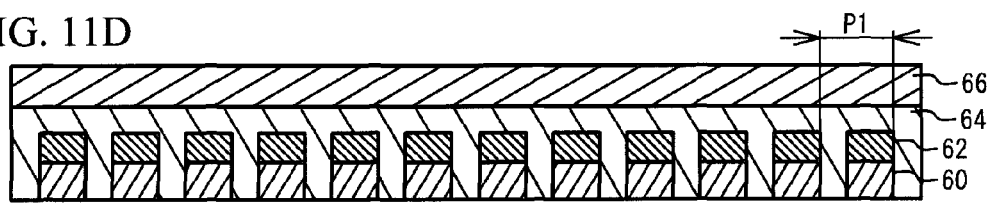

As illustrated in FIG. 11D, when the substrate 50 is placed in hydrofluoric and nitric acid, the silicon substrate is etched. In this case, the semiconductor layer 58 and the temporal fixing agent 64 are not dissolved. Thus, a semiconductor chip 60 including the semiconductor element 61 is formed. The semiconductor chip 60 is temporally fixed to the substrate 66. In this case, the interval P1 of the semiconductor chips 60 is kept to be the same as the semiconductor elements 61 illustrated in FIG. 11B.

Figure 12A:
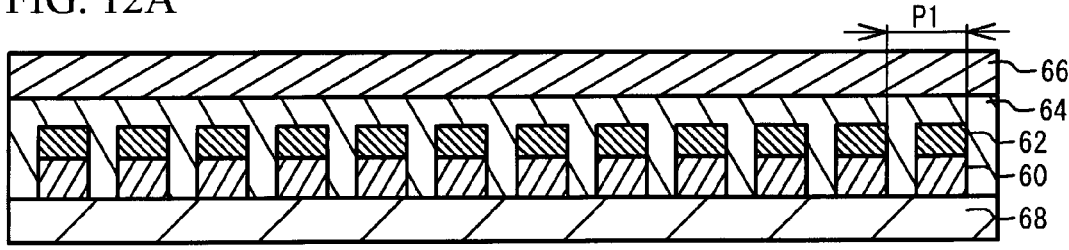
FIG. 12A through FIG. 12D illustrate the method of manufacturing the semiconductor device in accordance with the second embodiment.
Figure 12B:
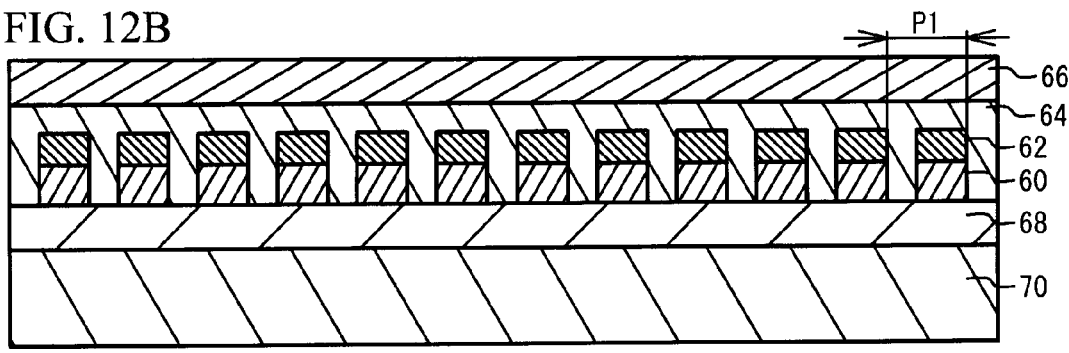

As illustrated in FIG. 12A, a temporal fixing agent 68 is coated on a lower face of the semiconductor chip 60 and the temporal fixing agent 64. It is preferable that the temporal fixing agent 68 is soluble in water and is insoluble in organic solvent. For example, poly vinyl alcohol is used as the temporal fixing agent 68. As illustrated in FIG. 12B, the temporal fixing agent 68 is adhered to a substrate 70. It is preferable that the substrate 70 is insoluble in water and organic solvent. For example, a silicon substrate or a sapphire substrate is used as the substrate 70.

Figure 12C:
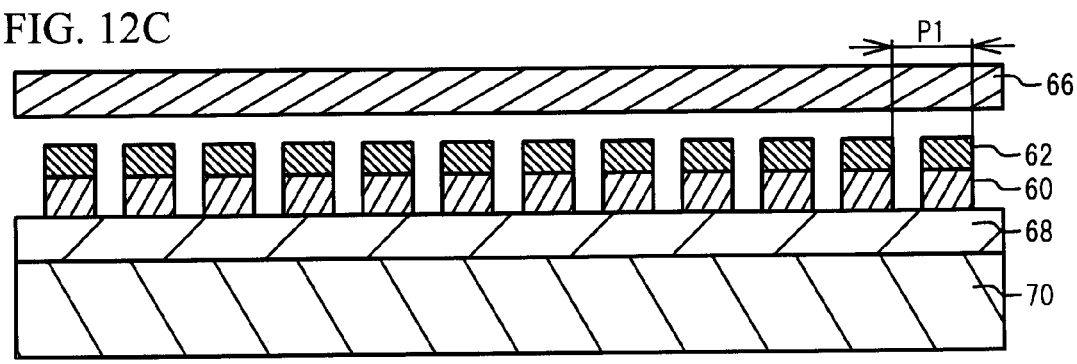

As illustrated in FIG. 12C, the temporal fixing agent 64 is placed in organic solvent. Thus, the temporal fixing agent 64 is dissolved and the substrate 66 is peeled. The lower face of the semiconductor chip 60 is temporally fixed to the substrate 70 with the temporal fixing agent 68. In this case, the interval P1 of the semiconductor chips 60 is kept to be the same as the interval P1 in FIG. 11B. In this way, the semiconductor chip 60 formed on the substrate 50 is moved on the substrate 70 with the interval P1 of the semiconductor chips 60 being constant. As another way to peel the substrate 66 and remove the temporal fixing agent 64, the temporal fixing agent 64 is melted and the substrate 66 is peeled when the temporal fixing agent 64 is heated so that the temporal fixing agent 68 is not metamorphosed before the temporal fixing agent 64 is placed in the organic solvent. After that, the temporal fixing agent 64 adhered to the semiconductor chip 60 is washed with use of organic solvent.

Figure 12D:
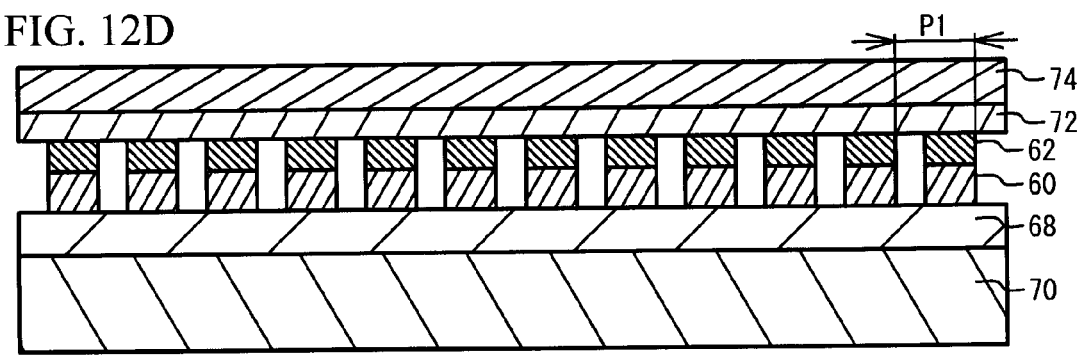

As illustrated in FIG. 12D, a substrate 74 is temporally fixed from the upper face side of the semiconductor chip 60 with use of a temporal fixing agent 72. The temporal fixing agent 72 has only to have resistance against water. Therefore, a convenient agent can be used as the temporal fixing agent 72. For example, a sheet to which an adhering and peeling agent with use of ultraviolet or an adhering and peeling agent with use of heat is adhered is used as the temporal fixing agent 72. The substrate 74 has to have resistance only against water. Therefore, a sapphire substrate can be used as the substrate 74. The sapphire substrate is transparent with respect to ultraviolet rays. Therefore, when the sheet to which the adhering and peeling agent with use of the ultraviolet is adhered is used as the temporal fixing agent 72, it is preferable that the sapphire substrate is used as the substrate 74.

Figure 13A:
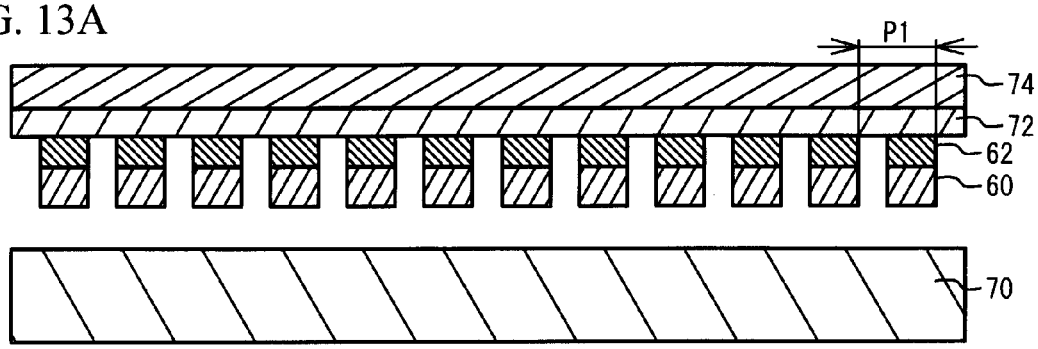
FIG. 13A through FIG. 13D illustrate the method of manufacturing the semiconductor device in accordance with the second embodiment.

As illustrated in FIG. 13A, the temporal fixing agent 68 is placed in water. Thus, the temporal fixing agent 68 is dissolved, and the substrate 70 is peeled. If the water is heated, a dissolving speed of the temporal fixing agent 68 gets larger. The upper face of the semiconductor chip 60 is temporally fixed to the substrate 74 with the temporal fixing agent 72. In this case, the interval P1 of the semiconductor chips 60 is kept to be the same as the interval P1 of FIG. 11B.

Figure 13B:
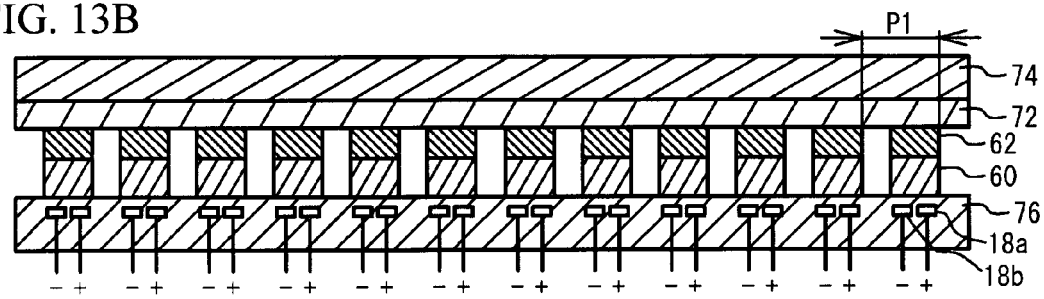

As illustrated in FIG. 13B, the lower face of the semiconductor chip 60 is adhered to a substrate 76. The substrate 76 is the electrostatic chuck in accordance with the first embodiment. The first electrode 18a to which a positive voltage is applied and the second electrode 18b to which a negative voltage is applied are provided in the substrate 76. It is possible to adsorb or peel the semiconductor chips 60 independently by applying or not applying a voltage to the first electrode 18a and the second electrode 18b. When a voltage is applied between the first electrode 18a and the second electrode 18b, all of the semiconductor chips 60 are adsorbed. In FIG. 13B, a pair of the first electrode 18a and the second electrode 18b are provided according to one of the semiconductor chips 60. However, a plurality of the first electrodes 18a and a plurality of the second electrodes 18b may be provided according to one of the semiconductor chips 60.

Figure 13C:
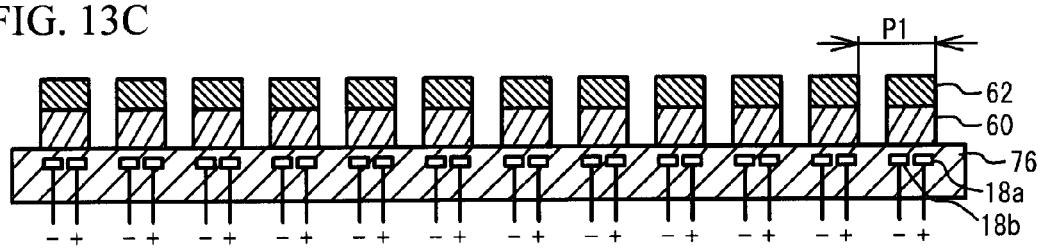

As illustrated in FIG. 13C, the temporal fixing agent 72 is subjected to ultraviolet rays through the substrate 74. Thus, the substrate 74 is peeled. The upper face of the semiconductor chip 60 is temporally fixed to the substrate 76. In this case, the interval P1 of the semiconductor chips 60 is kept to be the same as the interval P1 of FIG. 11B.

Figure 13D:
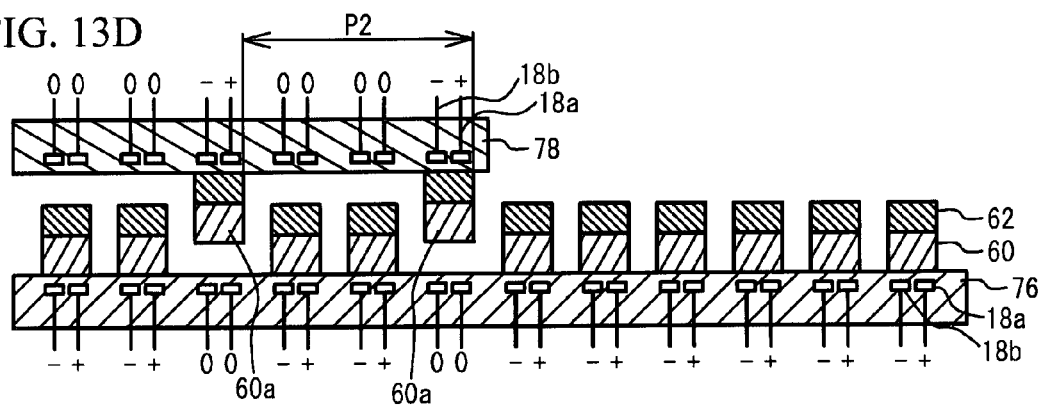

As illustrated in FIG. 13D, a pick-up device 78 picks up a semiconductor chip 60a. The pick-up device 78 is the electrostatic chuck in accordance with the first embodiment. A positive voltage is applied to the first electrode 18a of the pick-up device 78 according to the semiconductor chip 60a. A negative voltage is applied to the second electrode 18b of the pick-up device 78 according to the semiconductor chip 60a. The first electrode 18a and the second electrode 18b according to the semiconductor chip 60 other than the semiconductor chip 60a that is picked up are not subjected to a voltage (for example, subjected to zero voltage). On the other hand, the first electrode 18a and the second electrode 18b of the substrate 76 according to the semiconductor chip 60a are not subjected to a voltage (for example, subjected to zero voltage). That is, the adhering of the substrate 76 is canceled when the pick-up device 78 picks up the semiconductor chip 60a. The first electrode 18a and the second electrode 18b of the semiconductor chip 60 other than the semiconductor chip 60a that is picked up are subjected to a positive voltage and a negative voltage respectively. Thus, the semiconductor chip 60a can be picked up. The pick-up device 78 picks up the semiconductor chip 60a at a predetermined interval (the interval P2) of the semiconductor chips 60.

When the adsorbing force of the substrate 76 is selectively reduced, it is easy to selectively pick up the semiconductor chip 60. When the pick-up device 78 generates adsorbing force selectively, it is possible to control the interval of the semiconductor chips 60 arbitrarily. In this way, it is possible to pick up a necessary semiconductor chip 60 with high accuracy, by combining the selective reducing of the adsorbing force of the substrate 76 and the selective generating of the adsorbing force of the pick-up device 78. If only the selective reducing of the adsorbing force of the substrate 76 is performed and the picking up is performed with an adhesive tape, it is possible to move the plurality of semiconductor chips 60 at an arbitrary interval (the interval P2) on the adhesive tape. If a plurality of the semiconductor chips 60 are adhered to the adhesive tape and the adsorbing force of the pick-up device 78 is generated selectively, it is possible to pick up the semiconductor chips 60 at an arbitrary interval (the interval P2).

Figure 14A:
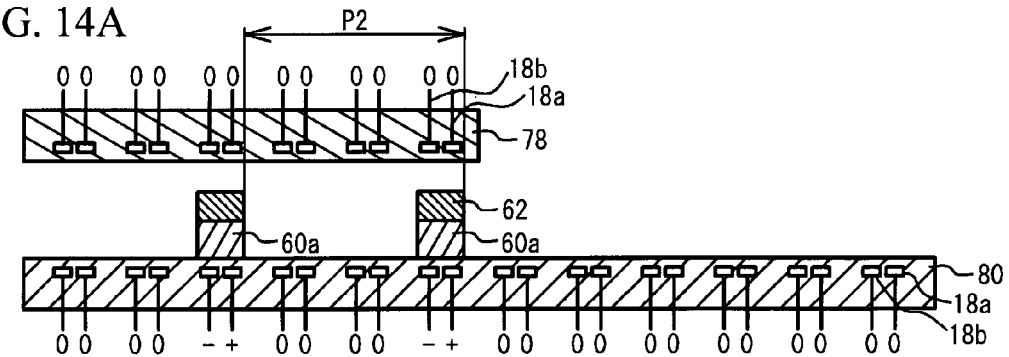
FIG. 14A through FIG. 14D illustrate the method of manufacturing the semiconductor device in accordance with the second embodiment.

As illustrated in FIG. 14A, the pick-up device 78 moves the semiconductor chip 60a on a substrate 80. The substrate 80 is the electrostatic chuck in accordance with the first embodiment. The first electrode 18a and the second electrode 18b of the pick-up device 78 according to the semiconductor chip 60a are not subjected to a voltage (for example, subjected to zero voltage). The first electrode 18a and the second electrode 18b of the substrate 80 according to the semiconductor chip 60a are subjected to a positive voltage and a negative voltage respectively. The first electrode 18a and the second electrode 18b according to an area other than the semiconductor chip 60a are not subjected to a voltage (for example, subjected to zero voltage). Thus, the semiconductor chip 60a can be adhered to the substrate 80. In this case, the interval P2 of the semiconductor chips 60a is kept to be the same as the interval P2 of FIG. 13D.

Figure 14B:
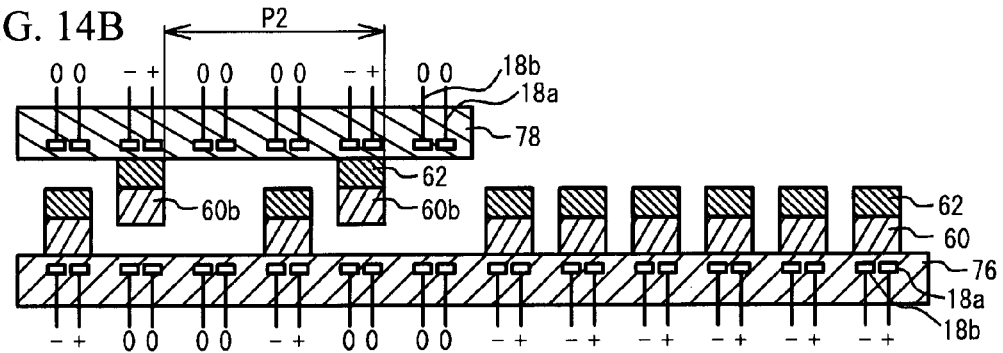
Figure 14C:
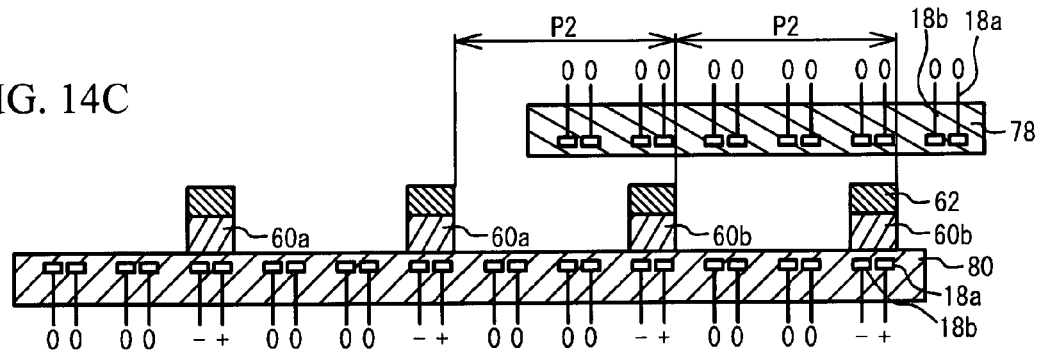

As illustrated in FIG. 14B, the pick-up device 78 picks up a semiconductor chips 60b of the semiconductor chips 60 at a predetermined interval (the interval P2), as well as FIG. 13D. As illustrated in FIG. 14C, the semiconductor chip 60b is adhered to the substrate 80 as well as FIG. 14A. In this case, the interval P2 of the semiconductor chips 60b is kept to be the same as the interval P2 of FIG. 14B. In this case, the semiconductor chips 60b can be adhered to the substrate 80 so that the interval of the semiconductor chips 60a and the semiconductor chips 60b is the interval P2, when the pick-up device 78 is adequately positioned on the substrate 80.

Figure 14D:
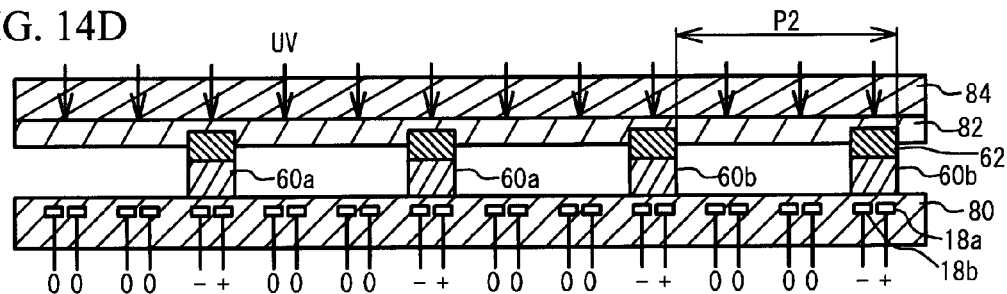

As illustrated in FIG. 14D, a substrate 84 is temporally fixed on the semiconductor chips 60a and 60b with a temporal fixing agent 82. It is preferable that the temporal fixing agent 82 is made of a material that hardens when subjected to ultraviolet rays. For example, the temporal fixing agent 82 is made of an ultraviolet curable resin of a hot-melt type. It is preferable that a substrate 86 is made of a material that is transparent with respect to ultraviolet rays. For example, a sapphire substrate is used as the substrate 86.

The temporal fixing agent 82 is coated on the lower face of the substrate 84. The temporal fixing agent 82 is mounted on the upper face of the protective film 62. Ultraviolet rays are radiated to the temporal fixing agent 82 through the substrate 84. Thus, the semiconductor chips 60a and 60b are temporally fixed to the substrate 84 with the temporal fixing agent 82. In this case, the interval P2 of the semiconductor chips 60a and 60b is kept to be the same as the interval P2 of FIG. 14C.

It is preferable that the lower face of the semiconductor chip 60a and the lower face of the semiconductor chip 60b form an identical plane. However, when the thickness of the protective film 62 is variable, the lower semiconductor chip 60a and the lower face of the semiconductor chip 60b fail to form an identical plane. When the lower face of the semiconductor chip 60a and the lower face of the semiconductor chip 60b fail to form an identical plane, the lower face of the semiconductor chip 60a and the lower face of the semiconductor chip 60b form an identical plane by adhering the semiconductor chips 60a and 60b to the substrate 84 as described below.

The temporal fixing agent 82 is coated on the lower face of the substrate 84. The thickness of the temporal fixing agent 82 is approximately equal to or twice as large as the variation of the thickness of the protective film 62. The thickness of the temporal fixing agent 82 is smaller than a minimum thickness of the protective film 62. The substrate 84 is located above the semiconductor chips 60a and 60b so that the temporal fixing agent 82 is buried in the protective film 62. Ultraviolet rays are radiated to the temporal fixing agent 82 through the substrate 84. The temporal fixing agent 82 is cured, and the protective film 62 is temporally fixed to the substrate 84. The lower face of the semiconductor chip 60a and the lower face of the semiconductor chip 60b form an identical plane because the variation of the thickness of the protective film 62 is absorbed by the temporal fixing agent 82.

Figure 15A:
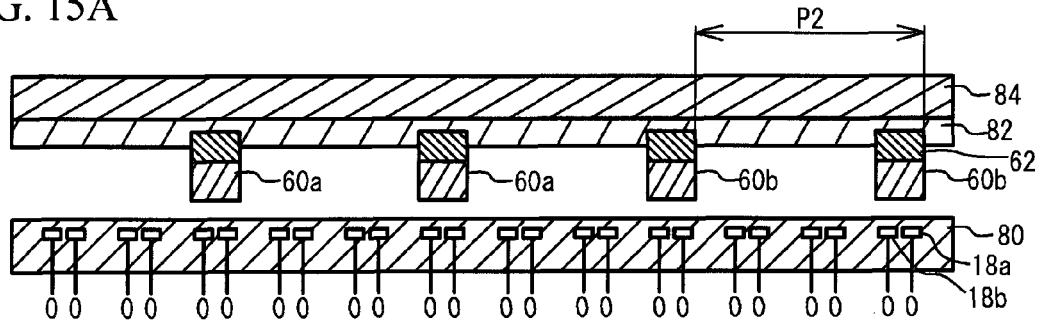
FIG. 15A through FIG. 15D illustrate the method of manufacturing the semiconductor device in accordance with the second embodiment.

As illustrated in FIG. 15A, when zero voltage is applied to all of the first electrodes 18a and the second electrode 18b of the substrate 80, the substrate 80 is peeled.

Figure 15B:
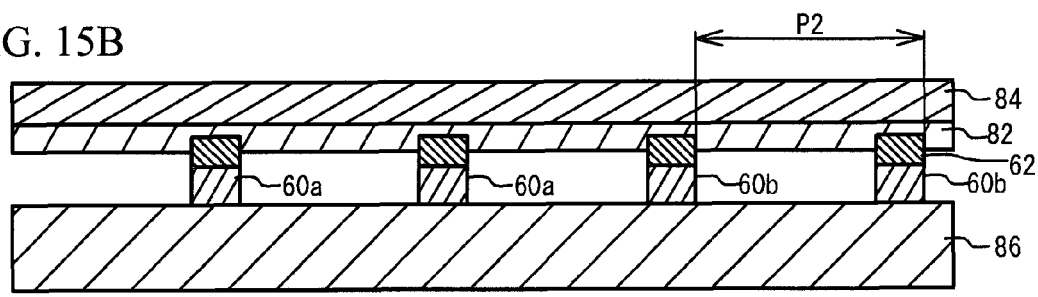

As illustrated in FIG. 15B, the lower faces of the semiconductor chip 60a and the semiconductor chip 60b are jointed to the substrate 86. A high resistance silicon substrate is used as the substrate 86. In this case, the interval P2 of the semiconductor chips 60a and 60b is kept to be the same as the interval P2 of FIG. 14C. A surface activation bonding method can be used as the bonding method. In the surface activation bonding method, an ion such as Ar ion is radiated to the lower faces of the semiconductor chips 60a and 60b and the upper face of the substrate 86 in super high vacuum of $10^{-6}$ Pa or less. Thus, the lower faces of the semiconductor chips 60a and 60b and the upper face of the substrate 86 are activated. When the lower faces of the semiconductor chips 60a and 60b and the upper face of the substrate 86 are adhered, the lower faces of the semiconductor chips 60a and 60b and the upper face of the substrate 86 are bonded. With the surface activation bonding method, the semiconductor chips 60a and 60b are bonded at room temperature. Thus, selection range of the temporal fixing agent 82 is broadened. And, thermal distortion after bonding is not occurred.

Figure 15C:
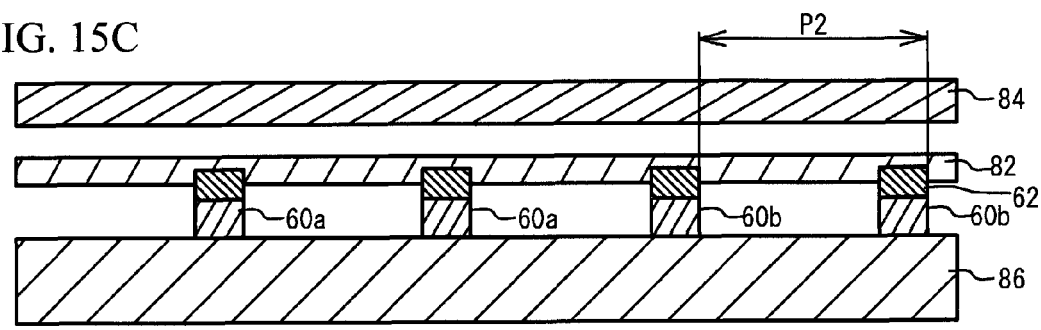
Figure 15D:
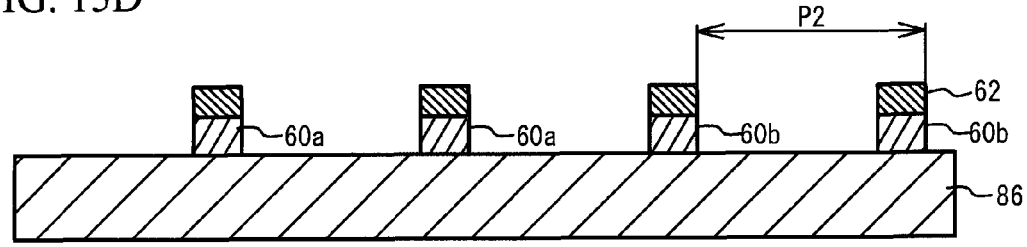

As illustrated in FIG. 15C, the temporal fixing agent 82 is heated to 80 degrees C., the adhering force of the temporal fixing agent 82 is reduced, and the substrate 84 is peeled. As illustrated in FIG. 15D, when the temporal fixing agent 82 is placed in organic solvent such as alcohol, the temporal fixing agent 82 is removed. An ultraviolet ray curing resin that is soluble in organic solvent is used as the temporal fixing agent 82. The processes of FIG. 15C and FIG. 15d may be merely a step of placing the temporal fixing agent 82 in organic solvent such as acetone.

Figure 16A:
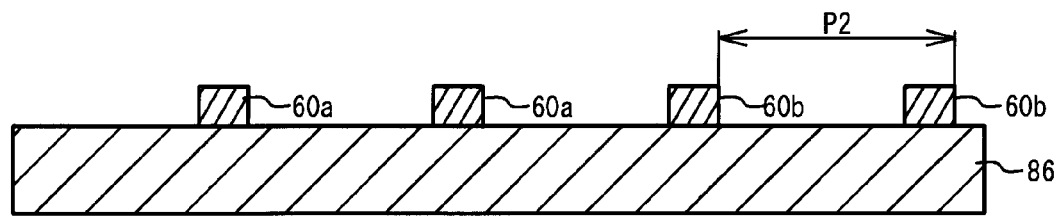
FIG. 16A through FIG. 16C illustrate the method of manufacturing the semiconductor device in accordance with the second embodiment.
Figure 16B:
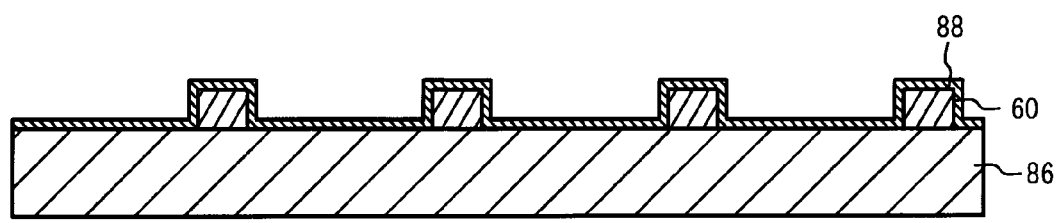
Figure 16C:
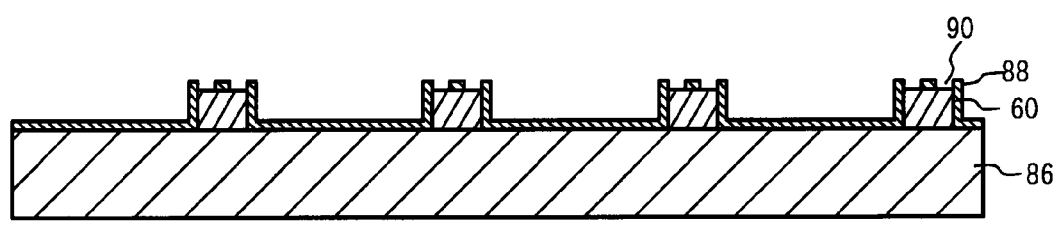

As illustrated in FIG. 16A, the protective film 62 is removed by an oxygen asking. As illustrated in FIG. 16B, an insulating film 88 is formed so as to cover the semiconductor chip 60 on the substrate 86. A nitride silicon film having a thickness of 300 nm is used as the insulating film 88. As illustrated in FIG. 16C, an opening 90 is formed in the insulating film 88.

Figure 17A:
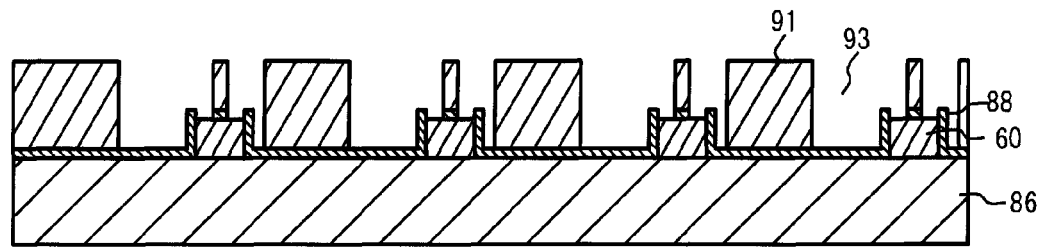
FIG. 17A through FIG. 17C illustrate the method of manufacturing the semiconductor device in accordance with the second embodiment.
Figure 17B:
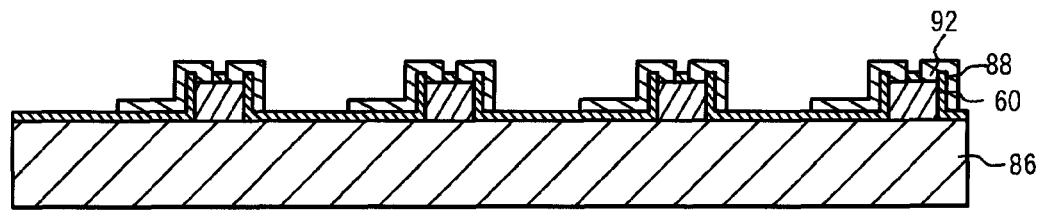
Figure 17C:
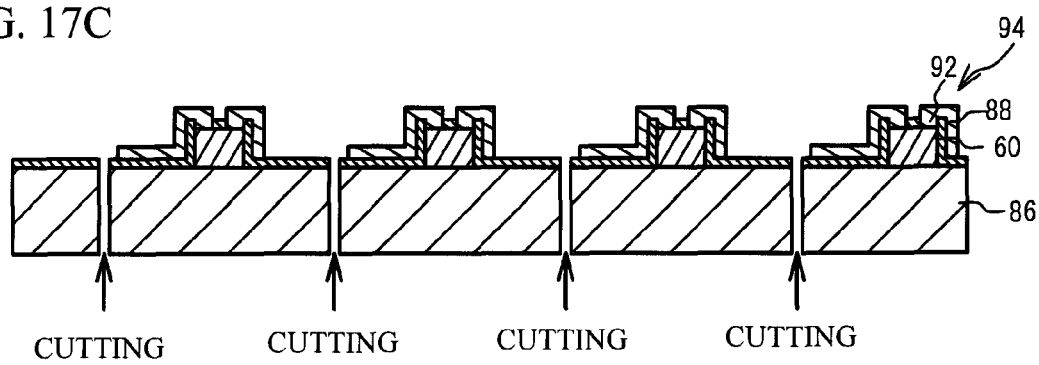

As illustrated in FIG. 17A, a photo resist 91 having an opening 93 is formed with a photo lithography method. As illustrated in FIG. 17B, a wiring 92 is formed in the opening 93 with a vapor deposition method and a lift off method. The wiring 92 may be formed as an electroplating method. Metal such as Au can be used as the wiring 92. As illustrated in FIG. 17C, the substrate 86 is cut down with a dicing method. Thus, the substrate 86 is divided into chips 94 on which one of the semiconductor chips 60 is mounted.

Figure 18A:
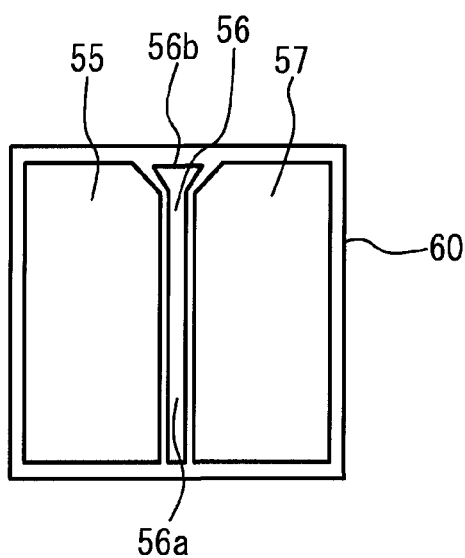
FIG. 18A illustrates a plane view of a semiconductor chip 60 of FIG. 11A.
Figure 18B:
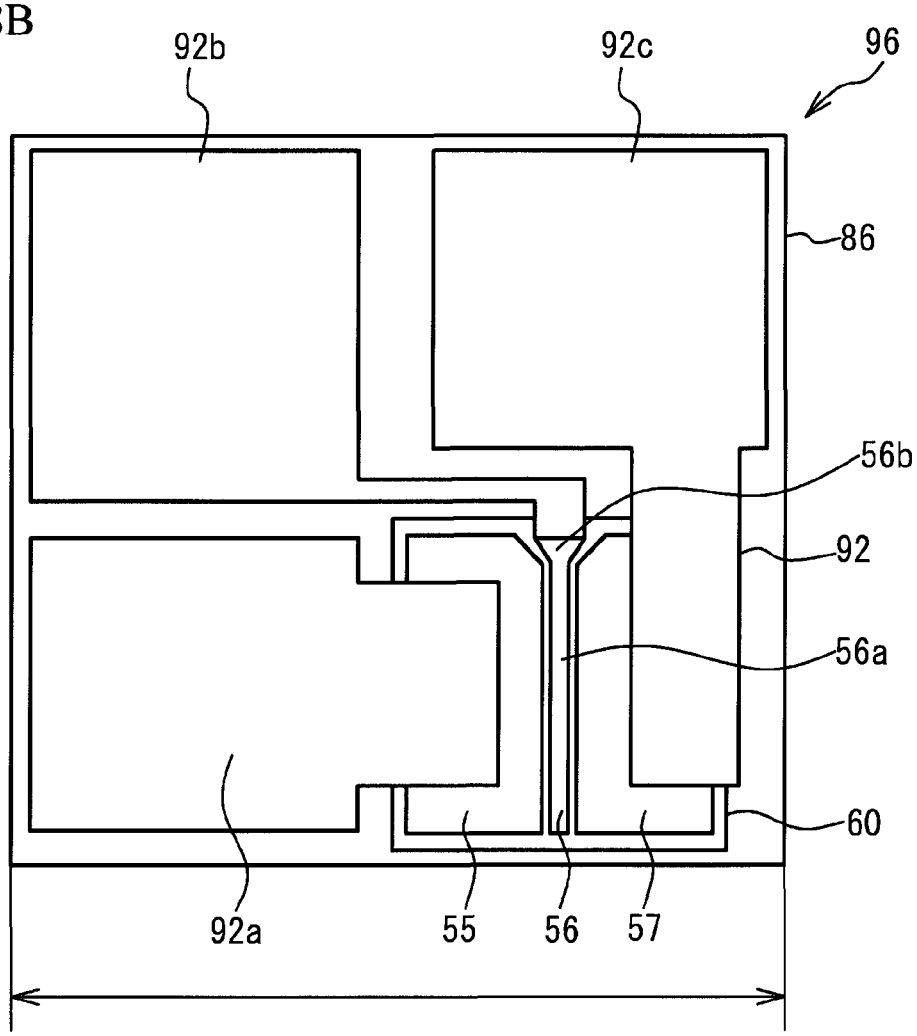
FIG. 18B illustrates a plane view of a chip 94 of FIG. 17C.

FIG. 18A illustrates a plane view of the semiconductor chip 60 of FIG. 11A. FIG. 18B illustrates a plane view of the chip 94 of FIG. 17C. As illustrated in FIG. 18A, the source electrode 55, the drain electrode 57 and the gate electrode 56 are formed on the upper face of the semiconductor chip 60. The gate electrode 56 has a finger 56a extending toward one direction and a pad 56b coupled to the finger 56a. The source electrode 55 and the drain electrode 57 sandwich the finger 56a. In FIG. 18A, the protective film 62 is not illustrated.

As illustrated in FIG. 18B, the semiconductor chip 60 is mounted on the substrate 86 of a chip 96. The wiring 92 is coupled to electrodes such as the source electrode 55, the drain electrode 57 and the gate electrode 56. The wiring 92 has pads 92a, 92c and 92b that are coupled to the source electrode 55, the drain electrode 57 and the gate electrode 56 on the substrate 86 respectively.

Figure 19A:
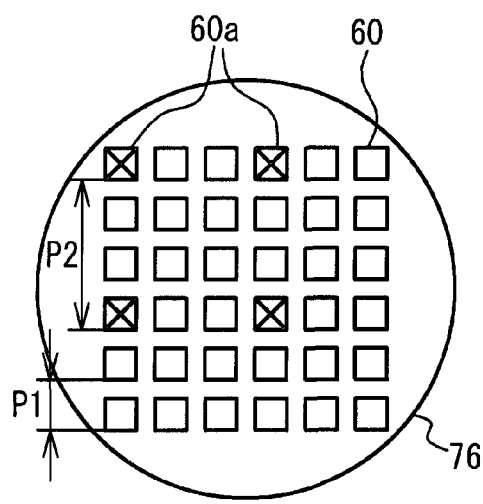
FIG. 19A through FIG. 19D illustrate an example of movement of a semiconductor chip to a substrate 80 from a substrate 76.
Figure 19B:
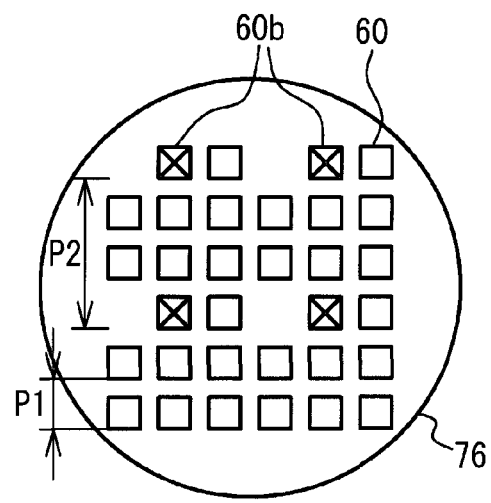
Figure 19C:
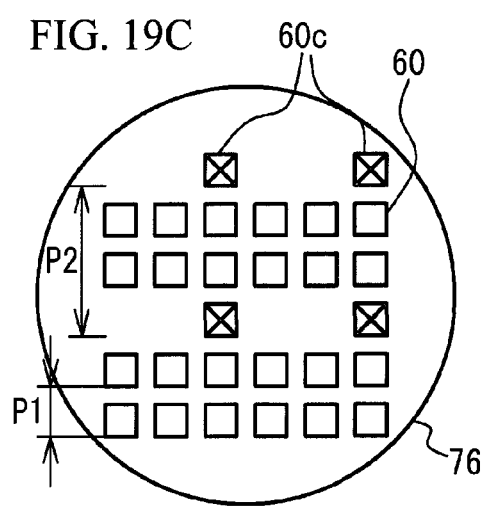
Figure 19D:
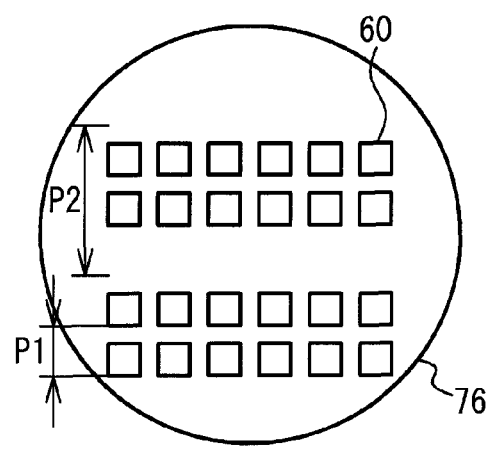
Figure 20:
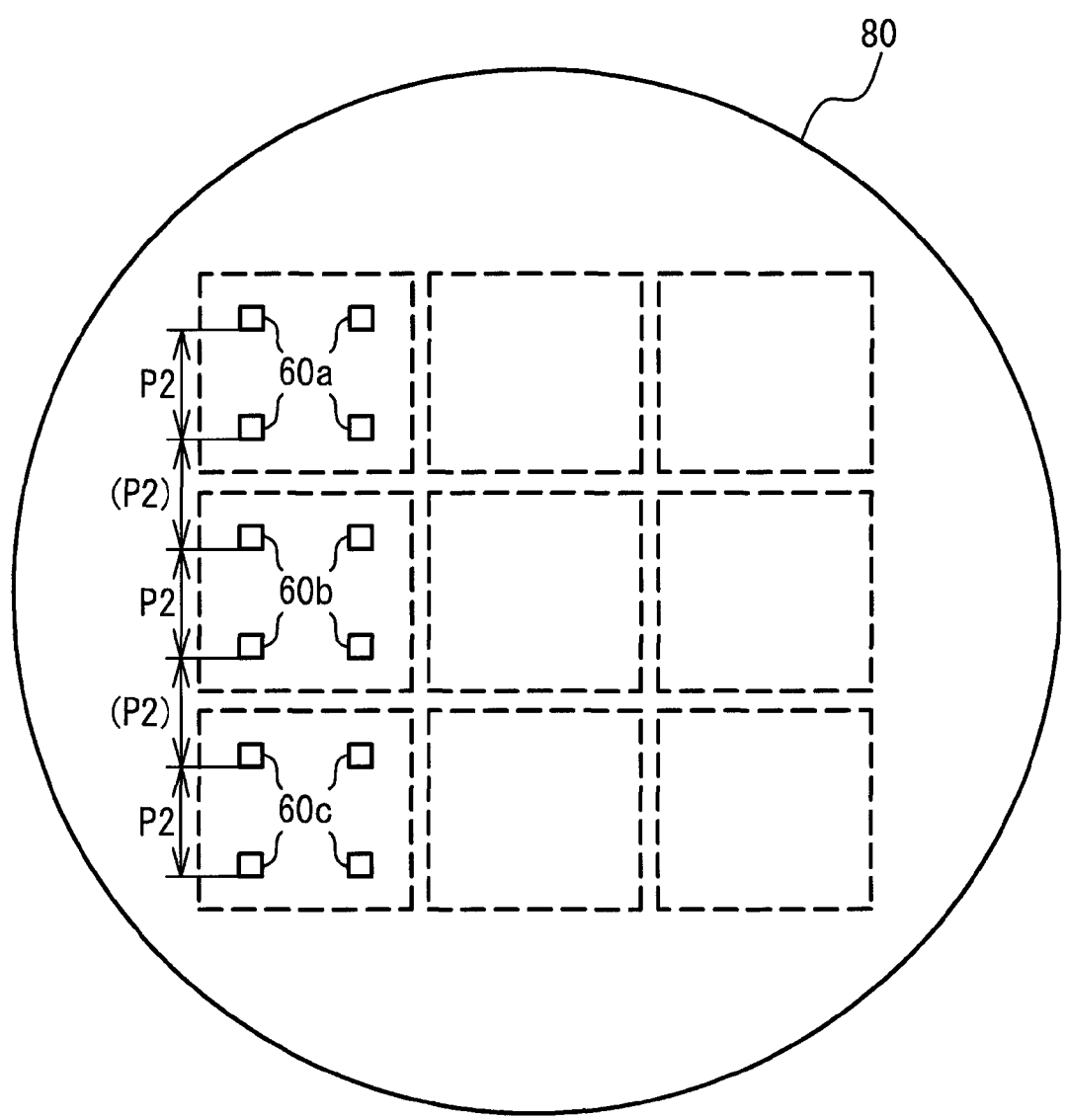
FIG. 20 illustrates an example of the movement of the semiconductor chip to the substrate 80 from the substrate 76.

FIG. 19A through FIG. 20 illustrate a plane view of a case where the semiconductor chip 60 is moved from the substrate 76 to the substrate 80. As illustrated in FIG. 19A, the semiconductor chips 60 are arrayed on the substrate 76 (corresponding to FIG. 13C). The array interval of the semiconductor chips 60 is the interval P1. The pick-up device 78 picks up the semiconductor chips 60a having the interval P2 of the semiconductor chips 60 on the substrate 76 at a time (corresponding to FIG. 13D). As illustrated in FIG. 20, the semiconductor chips 60a arrayed at the interval P2 are adhered on the substrate 80 (corresponding to FIG. 14A). A dotted line of FIG. 20 indicates a range on the substrate 80 where a semiconductor chip is moved with one time picking up.

As illustrated in FIG. 19B, the pick-up device 78 picks up the semiconductor chips 60b adjacent to the semiconductor chip 60a at a time. As illustrated in FIG. 20, the semiconductor chip 60b is adhered on the substrate 80. The semiconductor chips 60b may be adhered so that an interval between the semiconductor chips 60a and 60b is P2 if necessary in the following processes. As illustrated in FIG. 19C, the pick-up device 78 picks up semiconductor chips 60c adjacent to the semiconductor chip 60b. As illustrated in FIG. 20, the semiconductor chip 60c is adhered on the substrate 80. The semiconductor chip 60c may be adhered so that an interval between the semiconductor chips 60b and 60c is P2, if necessary in the processes after the process of FIG. 19D. Thus, the semiconductor chips 60 arrayed on the substrate 76 at the interval P1 are arrayed on the substrate 80 at the interval P2. The array interval of the semiconductor chips 60 on the substrate 76 may be different in a longitudinal direction from in a lateral direction. The array interval of the semiconductor chips 60 on the substrate 80 may be different in a longitudinal direction from in a lateral direction.

In accordance with the second embodiment, as illustrated in FIG. 13C, the substrate 76 (a first substrate) including the electrostatic chuck in accordance with the first embodiment adsorbs a plurality of the semiconductor chips 60 arrayed at the first interval P1 (a predetermined interval). By controlling the adsorbing force of the substrate 76, adsorbing force against a plurality of the semiconductor chips 60a is reduced because the semiconductor chips 60a are adhered at the second interval P2 that is broader than the first interval P1. As illustrated in FIG. 13D and FIG. 19A, the pick-up device 78 including the electrostatic chuck in accordance with the first embodiment picks up a plurality of the semiconductor chips 60a having the second interval P2 of a plurality of the semiconductor chips 60 at a time. The adsorbing force of the semiconductor chips 60a is reduced. As illustrated in FIG. 16A, a plurality of the semiconductor chips 60a and 60b are adhered to the substrate 86 (a second substrate) at the second interval P2 at a time. Thus, the semiconductor chips 60 arrayed at the first interval P1 are arrayed on the substrate 86 at the second interval P2. It is preferable that the second interval P2 is integer times of the first interval P1.

A vacuum chuck performing vacuum contact partially may be used so that the semiconductor chips 60 arrayed at the first interval P1 are arrayed at the second interval P2. However, it is necessary to form an adsorbing hole in the vacuum chuck. For example, when a size of the semiconductor chip 60 is 300 μm×300 μm or less, it is necessary to downsize the adsorbing hole. Thus, the conductance of flow current in the adsorbing hole is reduced, and it is difficult to secure the adsorbing force of a semiconductor element sufficiently.

The semiconductor element may be temporally fixed to a substrate with use of ultraviolet peeling resin, and an ultraviolet ray may be radiated to each semiconductor element independently. However, the ultraviolet ray is radiated through a substrate. It is therefore difficult to downsize an area to which the ultraviolet ray is radiated.

In contrast, when the electrostatic chuck in accordance with the first embodiment is used, the adsorbing force applied to the semiconductor element per unit area is determined by electric field value applied to the semiconductor element even if the area of the electrode 18 is downsized. The wiring for applying voltage to the electrode 18 may be thin, because a large electric current does not flow in the wiring. It is possible to form the electrode 18 so as to be sufficiently smaller than the semiconductor element by forming the electrode 18 with a lithography technology, a vapor deposition method or the like as well as the first embodiment. The method of using the electrostatic chuck is effective when the semiconductor element is small. For example, when the size of the semiconductor chip is 300 μm×300 μm or less, the method is specifically effective.

As illustrated in FIGS. 17A, 17B and 18B, the pads 92a to 92c to be coupled to an external component are formed on an area other than the area to which a plurality of the semiconductor chips 60 having the second interval P2 on the substrate 86 (a second substrate) are adhered, and a wiring 92 for coupling a semiconductor element provided in the semiconductor chip 60 and the pads 92a to 92c is formed through a semiconductor processes or the like. The forming of the pads and the forming of the wiring may be performed together or in different processes. Thus, as illustrated in FIG. 11A, a semiconductor chip having no pads is formed on the substrate 50. As illustrated in FIG. 15D, the semiconductor chip 60 is adhered on the substrate 86 (a second substrate) that is prepared differently. Pads are formed on the substrate 86. It is therefore possible to use an expensive nitride semiconductor only in the device area. And it is possible to form the pads on an inexpensive silicon substrate. A silicon substrate having low thermal conductivity but promoting growth of a nitride semiconductor can be used as the substrate 50 for growing the semiconductor layer 58 epitaxially. An inexpensive polycrystalline SiC substrate having high thermal conductivity can be used as the substrate 86 to which the semiconductor chip 60 is adhered. It is therefore possible to expand a range of choice of a substrate on which a semiconductor layer is grown.

As illustrated in FIG. 11B, a plurality of the semiconductor chips 60 are formed on the substrate 50 (a third substrate) at the first interval P1. As illustrated in FIG. 11C, the substrate 66 (a fourth substrate) supports the upper face of a plurality of the semiconductor chips 60 under a condition that the plurality of the semiconductor chips 60 keep the first interval P1. As illustrated in FIG. 11D, at least a part of the substrate 50 is removed under the condition that the substrate 66 supports the plurality of the semiconductor chips 60. That is, the plurality of the semiconductor elements 61 are divided into each semiconductor chip 60 by forming the plurality of the semiconductor elements 61 of which side face is spaced from each other on the substrate 50 (a third substrate) and reducing the thickness of the substrate 50. Thus, the plurality of the semiconductor chips 60 having the first interval P1 are formed. Thus, at least a part of the substrate 50 is removed under the condition that the semiconductor chips keep the interval. In FIG. 11D, all of the substrate 50 are removed. However, a part of the substrate 50 may be left.

As illustrated in FIG. 14C, the substrate 80 (a fifth substrate) including the electrostatic chuck of the first embodiment supports the lower face of the plurality of the semiconductor chips 60a and 60b having the second interval P2 picked up by the pick-up device 78. As illustrated in FIG. 15A, the substrate 84 (a sixth substrate) supports the upper face of the plurality of the semiconductor chips 60a and 60b having the second interval P2 from the substrate 80 (a fifth substrate). As illustrated in FIG. 15B, the plurality of the semiconductor chips 60a and 60b having the second interval P2 are adhered to the substrate 86 (a second substrate) from the substrate 84 (a sixth substrate). That is, the substrate 80 (a fifth substrate) including the electrostatic chuck of the first embodiment is prepared. The adsorbing force of the electrostatic chuck is controlled selectively according to the objective semiconductor chips 60a and 60b. The plurality of the semiconductor chips 60a and 60b that are picked up are moved on the substrate 80. The semiconductor chips 60a and 60b provided on the substrate 80 are adhered on the substrate 84 (a sixth substrate) at a time. The semiconductor chips 60a and 60b adhered to the substrate 84 are adhered to the substrate 86. Thus, the process for adhering the plurality of the semiconductor chips 60a and 60b on the substrate 86 at a time is performed. In this way, the semiconductor chip 60 can be adhered to the substrate 86 with the second interval P2 being kept, by using the substrate 80 including the electrostatic chuck of the first embodiment.

As illustrated in FIG. 13D and FIG. 14B, the process for picking up the plurality of the semiconductor chips 60a and 60b having the second interval P2 from the identical substrate 76 are performed more than one time. That is, a plurality of semiconductor chips can be arrayed at the interval P2 that is larger than the interval P1, when the process for picking up the plurality of the semiconductor chips 60a and 60b at a time are performed more than one time. Thus, as illustrated in FIG. 20, the semiconductor chips 60a to 60c can be arrayed at the second interval P2. The reason that the pick-up processes are performed more than one time is that a plurality of moving processes are needed when chips are moved to a larger substrate, as well as a case where chips formed on a 4-inches substrate are moved on a 8-inch substrate.

[Third Embodiment]

Figure 21A:
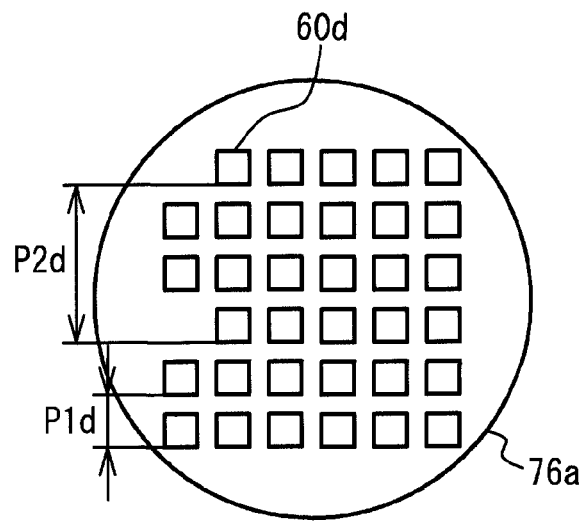
FIG. 21A through FIG. 21C illustrate an example of movement of a semiconductor chip to a substrate 80 from a substrate 76 of a third embodiment.
Figure 21B:
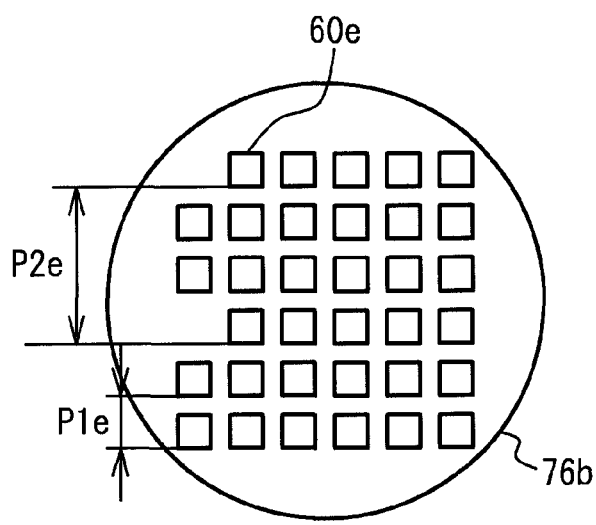
Figure 21C:
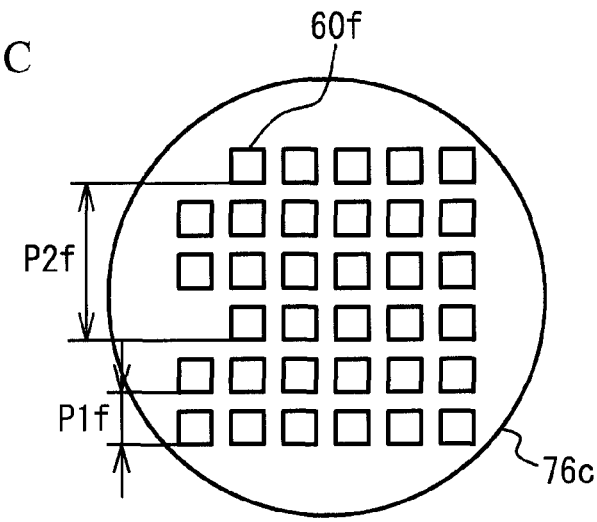
Figure 22:
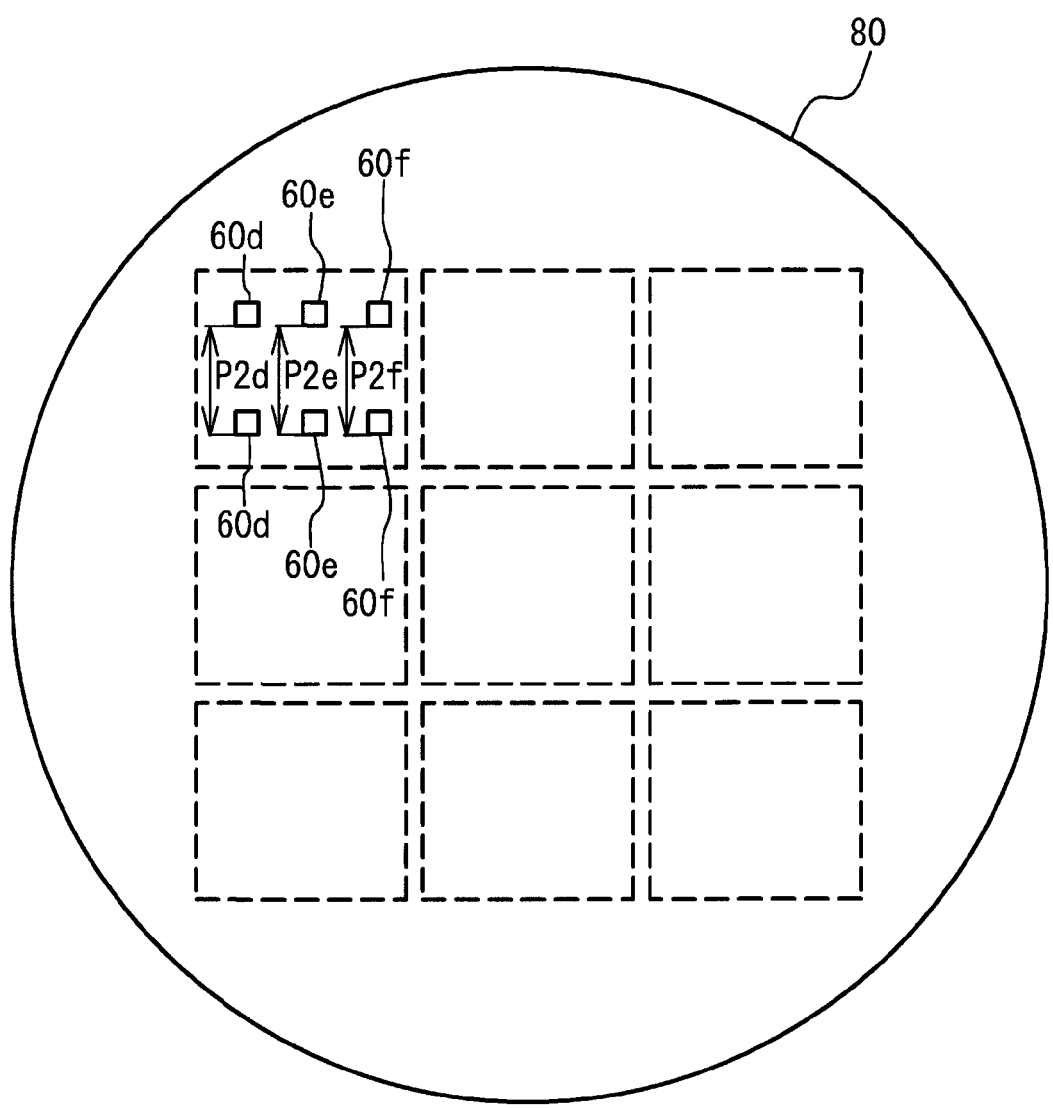
FIG. 22 illustrates an example of the movement of the semiconductor chip to the substrate 80 from the substrate 76 of the third embodiment.

A third embodiment is an example where different semiconductor chips are adhered to a substrate. FIG. 21A through FIG. 22 illustrate a plane view of a case where the semiconductor chip 60 is moved from the substrate 76 to the substrate 80. As illustrated in FIG. 21A, semiconductor chips 60d are arrayed on a substrate 76a at an interval P1d. As illustrated in FIG. 21B, semiconductor chips 60e are arrayed on a substrate 76b at an interval P1e. As illustrated in FIG. 21C, semiconductor chips 60f are arrayed on a substrate 76c at an interval P1f. The substrates 76a, 76b and 76c are a substrate including an electrostatic chuck as well as the substrate 76 of the second embodiment. The semiconductor chips 60d, 60e and 60f are, for example, an InP-based semiconductor element, a GaAs-based semiconductor element, a GaN-based semiconductor element respectively.

As illustrated in FIG. 21A, the pick-up device 78 picks-up the semiconductor chips 60d having the interval P2d on the substrate 76 at a time. As illustrated in FIG. 22, the semiconductor chips 60d arrayed at the interval P2d are adhered on the substrate 80. As illustrated in FIG. 21B, the pick-up device 78 picks up the semiconductor chips 60e having the interval P2e at a time. As illustrated in FIG. 22, the semiconductor chips 60e arrayed on the substrate 80 at the interval P2e are adhered. As illustrated in FIG. 21C, the pick-up device 78 picks up the semiconductor chips 60f having the interval P2f at a time. As illustrated in FIG. 22, the semiconductor chips 60f arrayed at the interval P2f are adhered on the substrate 80.

With the processes, different semiconductor chips 60d to 60f are adhered on the substrate 80. That is, the substrate 76a (a first substrate) supports a plurality of the semiconductor chips 60d arrayed at the interval P1d (a first interval). The pick-up device 78 picks up the plurality of the semiconductor chips 60d having the second interval P2d at a time. The plurality of the semiconductor chips 60d having the second interval P2d are adhered on the substrate 80 (a second substrate). The substrate 76b (another first substrate) supports a plurality of other semiconductor chips 60e arrayed at the interval P1e (another first interval). The pick-up device 78 picks up a plurality of other semiconductor chips 60e having the second interval P2e. The other plurality of the semiconductor chips 60e having the second interval P2e are adhered on the second substrate 80 at a time. The substrate 76c (another first substrate) supports other semiconductor chips 60f arrayed at the interval P1f (another first interval). The pick-up device 78 picks up the other semiconductor chips 60f having the second interval P2f. The other semiconductor chips 60f having the second interval P2f on the second substrate 80 are adhered on the second substrate 80 at a time.

In this way, plural groups of plural semiconductor chips 60d to 60f arrayed at the first intervals P1d to P1e are prepared. Plural picking up processes for picking up plural semiconductor chips at a time are performed with respect to the plural groups. A plurality of the semiconductor chips 60d to 60f picked up from the plural of groups are adhered on the common substrate 80 (a second substrate). Thus, semiconductor chips having different function can be integrated to a single substrate 80. For example, when a silicon substrate having high resistance and high thermal conductivity is used as the substrate 80, an isolation between the semiconductor chips 60*d* to 60*f* is improved, and a semiconductor device having high heat dissipation can be manufactured. The intervals P1*d* to P1*f* may be the same. The intervals P2*d* to P2*f* may be the same.

A SiC substrate, an AlN substrate or a Si substrate may be used as the substrate 80 of the second embodiment and the third embodiment. A polycrystalline SiC substrate or an AlN substrate may be used as the SiC substrate and the AlN substrate respectively. In this case, an inexpensive substrate having high thermal conductivity can be used.

The present invention is not limited to the specifically disclosed embodiments and variations but may include other embodiments and variations without departing from the scope of the present invention.

What is claimed is:

1. A method of manufacturing a semiconductor device comprising:
    adsorbing a plurality of first semiconductor chips periodically arrayed at a first interval with use of a first substrate including an electrostatic chuck device, protective films being formed on surfaces of the plurality of first semiconductor chips respectively;
    reducing adsorbing force against a plurality of second semiconductor chips among the plurality of first semiconductor chips periodically located at a second interval that is larger than the first interval by controlling adsorbing force of the first substrate;
    picking up simultaneously the plurality of second semiconductor chips through the protective films against which the adsorbing force was reduced;
    adhering simultaneously the plurality of second semiconductor chips to a second substrate; and
    removing the protective films from the plurality of second semiconductor chips after adhering simultaneously the plurality of second semiconductor chips to the second substrate,
    wherein the electrostatic chuck device comprises:
    a plurality of non-overlapping and predefined adsorption areas formed on a surface of said electrostatic chuck device, each of said plurality of adsorption areas comprising a plurality of first electrodes and a plurality of second electrodes alternately provided, each of the plurality of adsorption areas adsorbing a single first semiconductor chip, the plurality of adsorption areas being periodically arrayed in a matrix at the first interval;
    a first wiring electrically coupling between the plurality of first electrodes in an identical absorption area, the plurality of first electrodes of one of the plurality of adsorption areas being electrically isolated from the plurality of first electrodes of other adsorption areas;
    a second wiring electrically coupling between the plurality of second electrodes in the identical adsorption area, the plurality of second electrodes of one of the plurality of adsorption areas being electrically isolated from the plurality of second electrodes of other adsorption areas; and
    a control portion configured to control an electrostatic attractive force of each of the plurality of adsorption areas independently of other adsorption areas by applying a positive voltage and a negative voltage respectively to the first wiring and the second wiring of each of the plurality of adsorption areas independently of other adsorption areas.

2. The method as claimed in claim 1, wherein the picking up of the plurality of second semiconductor chips is performed by using an electrostatic chuck device.

3. The method as claimed in claim 1, wherein:
    the second substrate has a connection pad to be electrically coupled to an outer component; and
    the method further comprises forming a wiring between the pad and the plurality of second semiconductor chips after adhering the plurality of second semiconductor chips.

4. The method as claimed in claim 1, further comprising:
    forming a plurality of semiconductor elements of which side faces are spaced from each other on a third substrate, the plurality of semiconductor elements being periodically arranged at the first interval; and
    forming the plurality of first semiconductor chips periodically arrayed at the first interval by etching the third substrate.

5. The method as claimed in claim 1, wherein the adhering comprises:
    moving the picked-up plurality of second semiconductor chips to a substrate having an electrostatic chuck device;
    adhering the plurality of second semiconductor chips on the substrate to another substrate; and
    adhering the plurality of second semiconductor chips on the another substrate to the second substrate.

6. The method as claimed in claim 1 further comprising:
    arraying the plurality of second semiconductor chips at the second interval larger than the first interval by performing the picking up of the plurality of second semiconductor chips multiple times.

7. The method as claimed in claim 1 wherein:
    a plurality of groups of the plurality of first semiconductor chips arrayed at the first interval are prepared;
    the picking up of the plurality of second semiconductor chips are performed with respect to each of the groups; and
    the plurality of second semiconductor chips picked up from the groups are adhered to the second substrate.

8. A method of manufacturing a semiconductor device comprising:
    picking up simultaneously a plurality of first semiconductor chips periodically arrayed at a first interval through protective films respectively from a plurality of second semiconductor chips, of which the protective films are formed on surfaces, periodically arrayed at a second interval smaller than the first interval with use of an electrostatic chuck device;
    adhering simultaneously the plurality of first semiconductor chips to a second substrate; and
    removing the protective films from the plurality of first semiconductor chips after adhering simultaneously the plurality of first semiconductor chips to the second substrate,
    wherein the electrostatic chuck device comprises:
    a plurality of non-overlapping and predefined adsorption areas formed on a surface of said electrostatic chuck device, each of said plurality of adsorption areas comprising a plurality of first electrodes and a plurality of second electrodes alternately provided, each of the plurality of adsorption areas adsorbing a single second semiconductor chip, the plurality of adsorption areas being periodically arrayed in a matrix at the second interval;

a first wiring electrically coupling between the plurality of first electrodes in an identical adsorption area, the plurality of first electrodes of one of the plurality of adsorption areas being electrically isolated from the plurality of first electrodes of other adsorption areas;

a second wiring electrically coupling between the plurality of second electrodes in the identical adsorption area, the plurality of second electrodes of one of the plurality of adsorption areas being electrically isolated from the plurality of second electrodes of other of adsorption areas; and a control portion configured to control an electrostatic attractive force of each of the plurality of adsorption areas independently of other adsorption areas by applying a positive voltage and a negative voltage respectively to the first wiring and the second wiring of each of the plurality of adsorption areas independently of other adsorption areas.

9. The method as claimed in claim 8, wherein:

the second substrate has a connection pad to be electrically coupled to an outer component; and the method further comprises forming a wiring between the pad and the plurality of first semiconductor chips after adhering the plurality of first semiconductor chips.

10. The method as claimed in claim 8, further comprising:

forming a plurality of semiconductor elements of which side faces are spaced from each other on a third substrate, the plurality of semiconductor elements being periodically arranged at the second interval; and forming the plurality of second semiconductor chips periodically arrayed at the second interval by etching the third substrate.

11. The method as claimed in claim 8, wherein the adhering comprises:

moving the picked-up plurality of first semiconductor chips to a substrate having an electrostatic chuck device;

adhering the plurality of first semiconductor chips on the substrate to another substrate; and adhering the plurality of first semiconductor chips on the another substrate to the second substrate.

12. The method as claimed in claim 8 further comprising:

arraying the plurality of first semiconductor chips at the second interval larger than the first interval by performing the picking up of the plurality of first semiconductor chips multiple times.

13. The method as claimed in claim 8 wherein:

a plurality of groups of the plurality of second semiconductor chips arrayed at the second interval are prepared;

the picking up of the plurality of first semiconductor chips are performed with respect to each of the groups; and the plurality of first semiconductor chips picked up from the groups are adhered to the second substrate.

* * * * *